US008921684B2

(12) United States Patent
Shimizu et al.

(10) Patent No.: US 8,921,684 B2
(45) Date of Patent: Dec. 30, 2014

(54) SOLAR CELL MODULE AND MANUFACTURING METHOD THEREOF

(75) Inventors: Akira Shimizu, Osaka (JP); Katsuyuki Naitoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 846 days.

(21) Appl. No.: 13/131,973

(22) PCT Filed: Nov. 25, 2009

(86) PCT No.: PCT/JP2009/069846
§ 371 (c)(1),
(2), (4) Date: May 31, 2011

(87) PCT Pub. No.: WO2010/061844
PCT Pub. Date: Jun. 3, 2010

(65) Prior Publication Data
US 2011/0232748 A1  Sep. 29, 2011

(30) Foreign Application Priority Data

Nov. 28, 2008  (JP) ................................ 2008-304357

(51) Int. Cl.
*H02N 6/00* (2006.01)
*H01L 31/042* (2014.01)
*H01L 31/048* (2014.01)
*H01L 31/02* (2006.01)

(52) U.S. Cl.
CPC ........ *H01L 31/048* (2013.01); *H01L 31/02013* (2013.01); *H01L 31/0485* (2013.01); *Y02E 10/50* (2013.01)
USPC ...................................... 136/251

(58) Field of Classification Search
CPC .................... H01L 31/02013; H01L 31/0485
USPC ................................. 136/251, 259
See application file for complete search history.

(56) References Cited

U.S. PATENT DOCUMENTS

| | | | |
|---|---|---|---|
| 6,369,315 B1 * | 4/2002 | Mizukami et al. | 136/244 |
| 6,469,242 B1 * | 10/2002 | Kondo | 136/251 |
| 2003/0010377 A1 | 1/2003 | Fukuda et al. | |

FOREIGN PATENT DOCUMENTS

| | | |
|---|---|---|
| JP | 9-326497 | 12/1997 |
| JP | 11-195797 | 7/1999 |

(Continued)

OTHER PUBLICATIONS

European Search Report issued in U.S. Appl. No. 09/829,092 dated Dec. 4, 2012.
International Search Report for PCT/JP2009/069846, dated Feb. 2, 2010.

*Primary Examiner* — Eli Mekhlin
(74) *Attorney, Agent, or Firm* — Nixon & Vanderhye, P.C.

(57) ABSTRACT

In a solar cell module and a manufacturing method thereof according to an embodiment of the present invention, a solar cell (55) composed of a transparent electrode film, a photoelectric conversion layer and a back face electrode film is laminated on a light-transmitting insulating substrate (51). On the back face electrode film of the solar cell (55), an insulated lead wire (62, 63) and a back film (65) having an opening (65*a*) for drawing out an output lead portion (62*a*, 63*a*) of the lead wire (62, 63) are sequentially laminated. In such a solar cell module, an insulating sheet (11) is disposed between the back face electrode film of the solar cell (55) and the back film (65) so as to completely cover the opening (65*a*) of the back film (65). The insulating sheet (11) is disposed so as to cover the entire perimeter of the edge of the opening (65*a*) of the back film (65).

1 Claim, 23 Drawing Sheets

(56) References Cited

FOREIGN PATENT DOCUMENTS

| | | |
|---|---|---|
| JP | 2000-068542 | 3/2000 |
| JP | 2001-077383 | 3/2001 |
| JP | 2001-077385 | 3/2001 |
| JP | 2001-094137 | 4/2001 |
| JP | 2001-102616 | 4/2001 |
| JP | 2004-031646 | 1/2004 |
| JP | 2004-140100 | 5/2004 |

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

SOLAR CELL MODULE AND MANUFACTURING METHOD THEREOF

This application is the U.S. national phase of International Application No. PCT/JP2009/069846 filed 25 Nov. 2009 which designated the U.S. and claims priority to JP Patent Application No. 2008-304357 filed 28 Nov. 2008, the entire contents of each of which are hereby incorporated by reference.

TECHNICAL FIELD

The present invention relates to a solar cell module having a structure in which a solar cell is laminated on a light-transmitting insulating substrate, an insulated lead wire and a back face protective sheet having an opening for drawing out an output lead portion of the lead wire are sequentially laminated on a back face electrode film of the solar cell, and a method of manufacturing such a solar cell module. More specifically, the invention relates to a dielectric strength structure between the back face electrode film and the back face protective sheet in the solar cell.

BACKGROUND ART

Solar power generation systems for generating solar power in which solar cell modules, each including a plurality of solar cell strings arranged in a matrix, are placed on the roof of buildings or the like are beginning to come into wide use. In such a solar cell power generation system, each solar cell module is provided with a terminal box for enabling an electrical connection with another solar cell module placed adjacent to the solar cell module.

An example of a configuration of a solar cell string constituting a conventional solar cell module is shown in FIGS. 23(a) and 23(b) and FIG. 24. FIGS. 23(a) and 23(b) are illustrative diagrams showing two scenes of a manufacturing process thereof, and FIG. 24 is an illustrative diagram showing a step of laminating and sealing a solar cell string. The example of the configuration of the solar cell string shown in FIGS. 23 and FIG. 24 is also described in Patent Document 1.

A solar cell 115 is formed by laminating, although not shown in the drawings, a transparent electrode film made of a transparent conductive film, a photoelectric conversion layer and a back face electrode film in this order on a light-transmitting insulating substrate 111.

The solar cell 115 thus configured has, as shown in FIG. 23(a), an elongated rectangular shape with a length extending substantially across the entire width of the light-transmitting insulating substrate 111. A solar cell string 116 in which a plurality of solar cells 115 are connected in series is configured by connecting the transparent electrode film of one of each two adjacent solar cells 115 and the back face electrode film of the other solar cell to each other.

On an end of the transparent electrode film of the solar cell 115 located at one end of the solar cell string 116, a P-type electrode terminal portion 117 having a linear shape with substantially the same length as the solar cell 115 is formed, and on an end of the back face electrode film of the solar cell 115 located at the other end of the solar cell string 116, an N-type electrode terminal portion 118 having a linear shape with substantially the same length as the solar cell 115 is formed. The P-type electrode terminal portion 117 and the N-type electrode terminal portion 118 serve as electrode lead-out portions.

An insulating sheet 119 is placed on the solar cell string 116 so as to extend between a center area of the P-type electrode terminal portion 117 and a center area of the N-type electrode terminal portion 118. The insulating sheet 119 is placed such that it does not overlap the P-type electrode terminal portion 117 and the N-type electrode terminal portion 118. The insulating sheet 119 is preferably a film compatible to a sealant, and in particular, it is optimal to use a PET film, a fluorocarbon resin film or the like. In order to ensure the adhesion of the insulating sheet, a resin sheet for bonding may be placed between the insulating sheet 119 and the solar cells 115 or between the insulating sheet 119 and a lead wire 112 or 113, or these may be bonded in advance with an adhesive or the like.

On the other hand, a positive electrode current collecting portion 120 called bus bar and made of a copper foil having the same shape and size as the P-type electrode terminal portion 117 is electrically and mechanically bonded to the entire face of the P-type electrode terminal portion 117. Likewise, a negative electrode current collecting portion 121 having the same shape and size as the N-type electrode terminal portion 118 is electrically and mechanically bonded to the entire face of the N-type electrode terminal portion 118. As a means for bonding these, soldering or a conductive paste can be used, for example.

A positive electrode lead wire 122 and a negative electrode lead wire 123 that are made of flat cables are disposed in line (or parallel, i.e., disposed offset in the width direction) on the insulating film 119, with their tips opposing each other.

One end of the positive electrode lead wire 122 is connected to a center position of the positive electrode current collecting portion 120. The other end of the positive electrode lead wire 122 is located in a substantially center area of the solar cell string 116, and is bent so as to stand upright from the face of the solar cell string 116 (for example, perpendicularly with respect to the face) to serve as an output lead portion 122a. Likewise, one end of the negative electrode lead wire 123 is connected to a center position of the negative electrode current collecting portion 121. The other end of the negative electrode lead wire 123 is located in a substantially center area of the solar cell string 116, and is bent so as to stand upright from the face of the solar cell string 116 (for example, perpendicularly with respect to the face) to serve as an output lead portion 123a.

Although the positive electrode lead wire 122 and the negative electrode lead wire 123 extend across a plurality of solar cells 115, the insulating sheet 119 is present between the lead wires and the solar cells 115, and therefore the solar cells 115 will not be short-circuited. It is desirable that the width of the insulating sheet 119 is sufficiently larger than the width of the positive electrode lead wire 122 and the negative electrode lead wire 123, and the insulating sheet 119 is disposed in the form of a belt-like sheet extending from the positive electrode current collecting portion 120 to the negative electrode current collecting portion 121.

In this state, as shown in FIG. 24, a sealing film 124 and a back film 125 serving as a back face protection material for weather resistance and high insulation are laminated and sealed on the entire face of the solar cell string 116, with the output lead portions 122a and 123a of the positive electrode lead wire 122 and the negative electrode lead wire 123 passing through openings 124a and 125a. The sealing film 124 is preferably a thermoplastic polymer film, and in particular, it is optimal to use a film made of EVA (ethylene vinyl acetate resin) or PVB (polyvinyl butyral resin). The back film 125 is preferably, in order to ensure moisture resistance, a film including a moisture resistant layer such as a three-layer structure film of PET/Al/PET (PET: polyethylene terephthalate) or a three-layer structure film of PVF/Al/PVF (PVF: polyvinyl fluoride resin film).

In the solar cell string 116 thus configured, a terminal box (not shown) is attached and electrically connected to the output lead portions 122a and 123a of the positive electrode lead wire 122 and the negative electrode lead wire 123 protruding upward from the openings 125a of the back film 125.

When an opening 125a is formed in the three-layer structure back film 125 by punching or the like, the Al layer is exposed at the end face of the opening 125a. Accordingly, the distance between the exposed end face of the Al layer and the back electrode film of the solar cell 115 is shortened, and an electrical discharge may result when a dielectric strength test is performed. In particular, recent solar cell modules have increased voltages and require high voltages as dielectric strengths, and thus the above structure has a high possibility of occurrence of accidents caused by an electrical discharge.

Also, other than the dielectric strength between the end face of the Al layer of the back film 125 and the back face electrode film, the solar cell module having the above configuration has another problem in that there is a possibility that each opening 125a of the back film 125 might come into contact with the output lead portion 122a, 123a. In other words, because there is nothing to fix the opening 125a and the output lead portion 122a, 123a in a relative positional relationship between them, depending on the bending angle of the output lead portion 122a, 123a, the output lead portion 122a, 123a may come into contact with the opening 125a of the back film 125. If the output lead portion 122a, 123a comes into contact with the opening of the back film 125, the output lead portion 122a, 123a will come into contact with the end face of the Al layer of the opening 125a, and the two lead wires 122 and 123 of different polarities may be short-circuited. To address this, attempts have been heretofore made to prevent such short-circuiting between the output lead portion 122a, 123a and the end face of the opening 125a (see, for example, Patent Document 2).

Patent Document 2 discloses a thin film solar cell module having a structure in which, as shown in FIGS. 5(D) and 6(E) of Patent Document 2, a tedler sheet piece having slits which are slightly larger than holes of a protective cover is set around solder-plated copper foils (the output lead portions 122a and 123a in the above-described configuration) on a filler sheet, an EVA sheet piece 12 having substantially the same size is set, and the back face protective cover is set the EVA sheet piece 12. Then, the solder-plated copper foils are caused to project through the openings of the back face protective cover and fixed, using a heat resistant tape, in such a position that each copper foil and the back face protective cover will not come into contact with each other. Therefore, the sheets will not shift out of position relative to each other during a vacuum laminating step, and thus short-circuiting will not occur.

PRIOR ART DOCUMENTS

Patent Documents

Patent Document 1: JP H9-326497 A
Patent Document 2: JP 2001-77385 A

SUMMARY OF INVENTION

Problems to be Solved by the Invention

As described above, the problem of short-circuiting caused by contact between the end face of the Al layer exposed at the end face of the opening of the back film and the output lead portion has already been solved by Patent Document 2. However, Patent Document 2 does not give consideration to the possibility of occurrence of an electrical discharge between the exposed end face of the Al layer and the back face electrode film of the solar cell when a dielectric strength test is performed, and provides no suggestion to solve the problem. As described above, recent solar cell modules have increased voltages and require high voltages as dielectric strengths.

The present invention has been conceived to solve the problems described above, and it is an object of the present invention to provide a solar cell module in which a sufficient dielectric strength can be ensured between the back face electrode film of the solar cell and the end face of the opening of the back face protective sheet, and a method of manufacturing such a solar cell module.

Means for Solving the Problems

In order to solve the problems described above, a solar cell module according to the present invention is applied to a solar cell module having a structure in which a solar cell including a transparent electrode film, a photoelectric conversion layer and a back face electrode film is laminated on a light-transmitting insulating substrate, and an insulated lead wire and a back face protective sheet having an opening for drawing out an output lead portion of the lead wire are sequentially laminated on the back face electrode film of the solar cell, and is configured such that an insulating sheet is disposed between the back face electrode film and the back face protective sheet so as to cover an entire perimeter of an edge of the opening of the back face protective sheet.

A method of manufacturing a solar cell module according to the present invention includes the steps of laminating a solar cell including a transparent electrode film, a photoelectric conversion layer and a back face electrode film on a light-transmitting insulating substrate and sequentially laminating, on the back face electrode film of the solar cell, an insulated lead wire and a back face protective sheet having an opening for drawing out an output lead portion of the lead wire, wherein the method includes a step of disposing an insulating sheet between the back face electrode film and the back face protective sheet so as to cover an entire perimeter of an edge of the opening of the back face protective sheet.

As described above, in the case where the back face protective sheet is a sheet including a moisture resistant layer, such as a three-layer structure sheet of PET/Al/PET or a three-layer structure sheet of PVF/Al/PVF, the end face of the Al layer will be exposed at the end face of the opening. Accordingly, there is a possibility of the occurrence of an electrical discharge between the end face of the Al layer and the back face electrode film of the solar cell module. However, in the present invention, an insulating sheet is disposed between the back face electrode film and the back face protective sheet so as to cover the entire perimeter of the edge of the opening of the back face protective sheet, and therefore, an electrical discharge can be blocked. It is therefore possible to ensure a sufficient dielectric strength without causing an electrical discharge even when a dielectric strength test at a high voltage corresponding to high voltage solar cell modules is performed.

Also, according to the present invention, the insulating sheet may be disposed at least along the entire perimeter of the edge of the opening of the back face protective sheet. For example, in the case where the opening is rectangular and an insulating sheet having an elongated rectangular shape is used, four such rectangular insulating sheets may be disposed, one along each edge of the rectangular opening, so as to form a quadrangular shape having four sides. In other words, the insulating sheet may not be present in the center portion of the opening from which the output lead portion of the lead wire is drawn out.

Also, according to the present invention, the insulating sheet may be disposed between the lead wire and the back face protective sheet, and the lead wire is fixed onto the back face electrode film by a sticky material on an underside of the insulating sheet. In other words, with the present invention, the insulating sheet has, in addition to the original function of providing insulation between the back face electrode film and the end face of the opening of the back face protective sheet, a function of serving as a fixing member that fixes the position of the lead wire disposed on the back face electrode film. Accordingly, by simply disposing the insulating sheet, the lead wire can be disposed and fixed in a position in which the lead wire is not in contact with the end face of the opening of the back face protective sheet.

Also, in this connection, in the case where the back face electrode film and the back face protective sheet are bonded together using a resin sheet, it may be possible to laminate the back face electrode film, the resin sheet, the lead wire, the insulating sheet and the back face protective sheet in this order, and attach the insulating sheet to the resin sheet such that the lead wire is sandwiched by the resin sheet and the insulating sheet. The resin sheet softens in a bonding step, but if the resin sheet has a sufficient strength to fix the lead wire, it is useful to fix the lead wire when conveyed during production and while drawing the vacuum in laminate processing.

Furthermore, in the case where a resin sheet piece (a resin sheet smaller than the back face protective sheet) is used to bond the back face electrode film and the lead wire together, the insulating sheet may be attached to this resin sheet to fix the lead wire. In this case as well, the effect of fixing the lead wire can be obtained until the vacuum is drawn in laminate processing Also, according to the present invention, the insulating sheet may be sized to cover the entire opening of the back face protective sheet and disposed between the back face electrode film and the lead wire, with one edge of the insulating sheet being disposed so as to overlap an end of an insulating film disposed on the underside of the lead wire and the other edge being bonded or adhesively fixed to the underside of the other edge of the opening. By disposing the insulating sheet between the back face electrode film and the lead wire in the manner described above, it is sufficient that the covering on the underside of the lead wire partially overlaps the edge of the insulating sheet, and the insulating film does not necessarily extend further than that position on the lead wire. Accordingly, when the lead wire is bent and raised from the opening of the back face protective sheet, the lead wire can be easily bent at any angle desired by the user because the insulating film is not provided on the bent portion.

Also, according to the present invention, the insulating sheet may be sized to cover the entire opening of the back face protective sheet and disposed between the lead wire whose underside is covered by an insulating film and whose upperside is exposed and the back face protective sheet, and the lead wire may be folded over an end of the insulating sheet so as to enfold the end and drawn upward from the opening of the back face protective sheet. With this configuration, it is sufficient that the lead wire is covered only on one side by the insulating film between the insulating sheet and the back face electrode film, and it is unnecessary to provide the covering on the other side of the bent portion of the lead wire. Accordingly, the lead wire can be bent easily while the insulated state is maintained.

Also, according to the present invention, it is also possible that any of the ends of the insulating sheet other than the end enfolded by the lead wire is bonded or adhesively fixed to an underside of the edge of the opening. In other words, when the lead wire is bent and folded over the end of the insulating sheet, there is a possibility that the insulating sheet might shift out of position, but by bonding or adhesively fixing any of the ends of the insulating sheet other than the end enfolded by the lead wire to the underside of the edge of the opening as in the present invention, it is possible to prevent the insulating sheet from shifting out of position, and the insulating sheet can be reliably disposed and fixed in an appropriate position to cover the entire opening.

Also, according to the present invention, the insulating sheet may be disposed so as to perimetrically cover an end face of the opening of the back face protective sheet. More specifically, the insulating sheet may be disposed so as to perimetrically cover an underside and an upperside of the edge of the opening and an end face of the opening. Particularly, it is important that the covering of the insulating sheet is provided up to the underside of edge of the opening. By directly covering the edge of the opening with the insulating sheet in the manner described above, an electrical discharge between the end face of the Al layer at the end face of the opening and the back face electrode film can be prevented with reliability. It is therefore possible to obtain a sufficient dielectric strength without causing an electrical discharge even when a dielectric strength test at a high voltage corresponding to high voltage solar cell modules is performed.

Also, according to the present invention, the insulating sheet may be partially or entirely substituted by an insulating film of the lead wire. For example, as shown in FIGS. 17, one side of the insulating sheet covering the edge of the opening 65a may be an insulating film (upper covering insulating film 61a) of the lead wire 63. Alternatively, as shown in FIGS. 16, all of four sides of the opening 65a may be covered by an insulating film (lower covering insulating film 61b) of the lead wire 63.

Furthermore, in the present invention, a plurality of methods are presented for attaching or fixing the insulating sheet, but the insulating sheet may be composed of a plurality of pieces and may be attached or fixed by other methods. For example, as the insulating sheet covering the opening of the back face protective sheet, insulating sheet pieces may be disposed such that one disposed on the lead wire is used to fix the lead wire, and the others are disposed to cover the end face of the opening. Also, the insulating sheet may be substituted by an insulating film formed on the back face electrode.

Effects of the Invention

Because the present invention is configured as described above, an electrical discharge between the back face electrode film of the solar cell module and the end face of the opening of the back face protective sheet can be blocked with reliability. It is therefore possible to obtain a sufficient dielectric strength without causing an electrical discharge even when a dielectric strength test at a high voltage is performed, and thus the voltage of the solar cell module can be increased.

BRIEF DESCRIPTION OF DRAWINGS

FIGS. 1 show a solar cell module of Configuration Example 1 according to an embodiment of the present invention, with FIGS. 1(a) and 1(b) showing two scenes of a manufacturing process thereof.

FIG. 2 is an illustrative diagram showing a step of laminating and sealing a solar cell string.

FIG. 3 is a partially enlarged perspective view showing the periphery of output lead portions.

FIG. 4 is a partially enlarged perspective view showing the periphery of output lead portions applied to a solar cell module of Configuration Example 2 according to the embodiment of the present invention.

FIG. 5 is a plan view of the periphery of openings for showing the shape and arrangement of an insulating sheet of Specific Example 1.

FIG. 6 is a cross-sectional view (end view) of the periphery of openings for showing the shape and arrangement of the insulating sheet of Specific Example 1.

FIG. 7(a) is a plan view of the periphery of an opening, for showing the shape and arrangement of an insulating sheet of Specific Example 2, and FIG. 7(b) is a cross-sectional view (end view) thereof.

FIG. 8(a) is a plan view of the periphery of an opening, for showing the shape and arrangement of an insulating sheet of Specific Example 3, and FIG. 8(b) is a cross-sectional view (end view) thereof.

FIG. 9(a) is a plan view of the periphery of an opening, for showing the shape and arrangement of an insulating sheet of Specific Example 4, and FIG. 9(b) is a cross-sectional view (end view) thereof.

FIG. 10(a) is a plan view of the periphery of an opening, for showing the shape and arrangement of an insulating sheet of Specific Example 5, and FIG. 10(b) is a cross-sectional view (end view) thereof.

FIG. 11(a) is a plan view of the periphery of an opening, for showing the shape and arrangement of an insulating sheet of Specific Example 6, and FIG. 11(b) is a cross-sectional view (end view) thereof.

FIG. 12(a) is a plan view of the periphery of an opening, for showing the shape and arrangement of an insulating sheet of Specific Example 7, and FIG. 12(b) is a cross-sectional view (end view) thereof.

FIG. 13(a) is a plan view of the periphery of an opening, for showing the shape and arrangement of an insulating sheet of Specific Example 8, and FIG. 13(b) is a cross-sectional view (end view) thereof.

FIG. 14(a) is a plan view of the periphery of an opening, for showing the shape and arrangement of an insulating sheet of Specific Example 9, and FIG. 14(b) is a cross-sectional view (end view) thereof.

FIG. 15(a) is a plan view of the periphery of an opening, for showing the shape and arrangement of an insulating sheet of Specific Example 10, and FIG. 15(b) is a cross-sectional view (end view) thereof.

FIG. 16(a) is a plan view of the periphery of an opening, for showing the shape and arrangement of an insulating sheet of Specific Example 11, and FIG. 16(b) is a cross-sectional view (end view) thereof.

FIG. 17(a) is a plan view of the periphery of an opening, for showing the shape and arrangement of an insulating sheet of Specific Example 12, and FIG. 17(b) is a cross-sectional view (end view) thereof.

FIG. 18(a) is a plan view of the periphery of an opening, for showing the shape and arrangement of an insulating sheet of Specific Example 13, and FIG. 18(b) is a cross-sectional view (end view) thereof.

FIG. 19(a) is a plan view of the periphery of an opening, for showing the shape and arrangement of an insulating sheet of Specific Example 14, and FIG. 19(b) is a cross-sectional view (end view) thereof.

FIG. 20(a) is a plan view of the periphery of an opening, for showing the shape and arrangement of an insulating sheet of Specific Example 15, and FIG. 20(b) is a cross-sectional view (end view) thereof.

FIG. 21(a) is a plan view of the periphery of an opening, for showing the shape and arrangement of an insulating sheet of Specific Example 16, and FIG. 21(b) is a cross-sectional view (end view) thereof.

FIG. 22(a) is a plan view of the periphery of an opening, for showing the shape and arrangement of an insulating sheet of Specific Example 17, and FIG. 22(b) is a cross-sectional view (end view) thereof.

FIGS. 23 show an example of a configuration of a conventional solar cell string, with FIGS. 23(a) and 23(b) showing two scenes of a manufacturing process thereof.

FIG. 24 is an illustrative diagram showing a step of laminating and sealing a conventional solar cell string.

MODES FOR CARRYING OUT THE INVENTION

Hereinafter, embodiments of the present invention will be described with reference to the drawings.

Description of Solar Cell Module of Configuration Example 1

Figure 1:
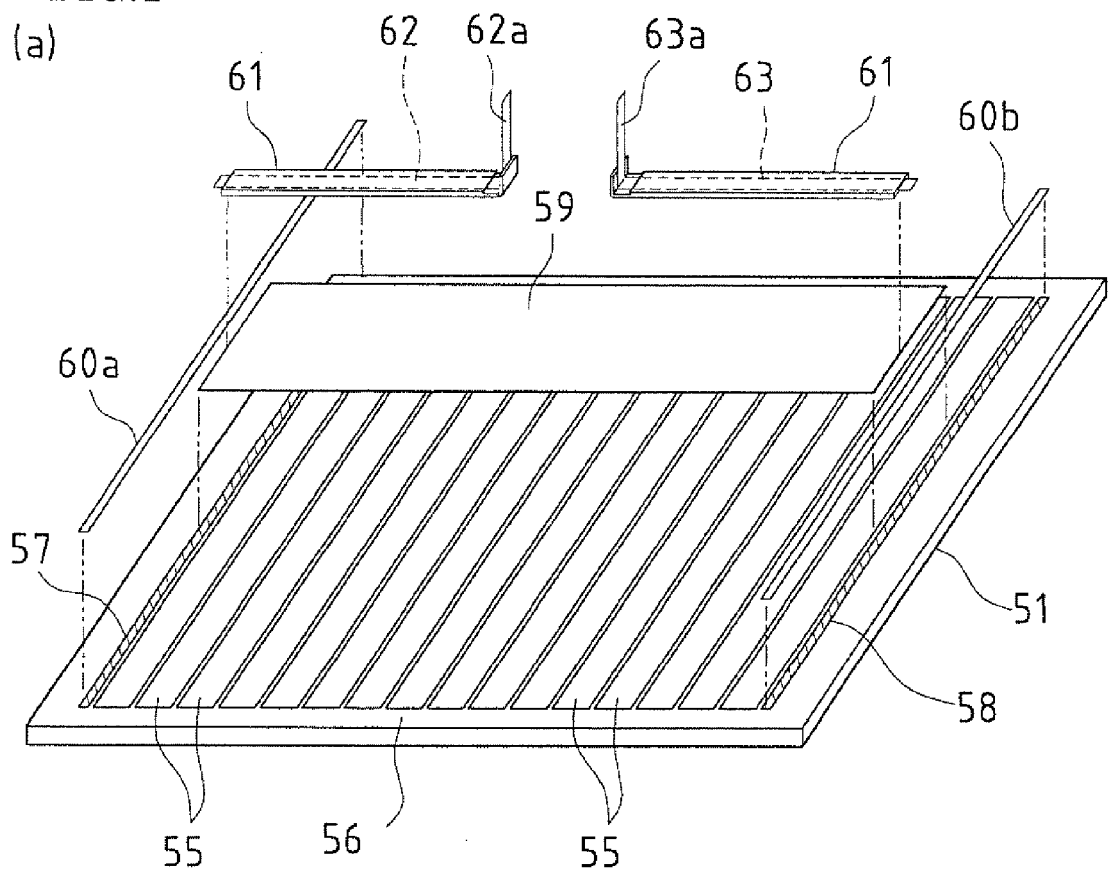
[FIG. 1]
Figure 1:
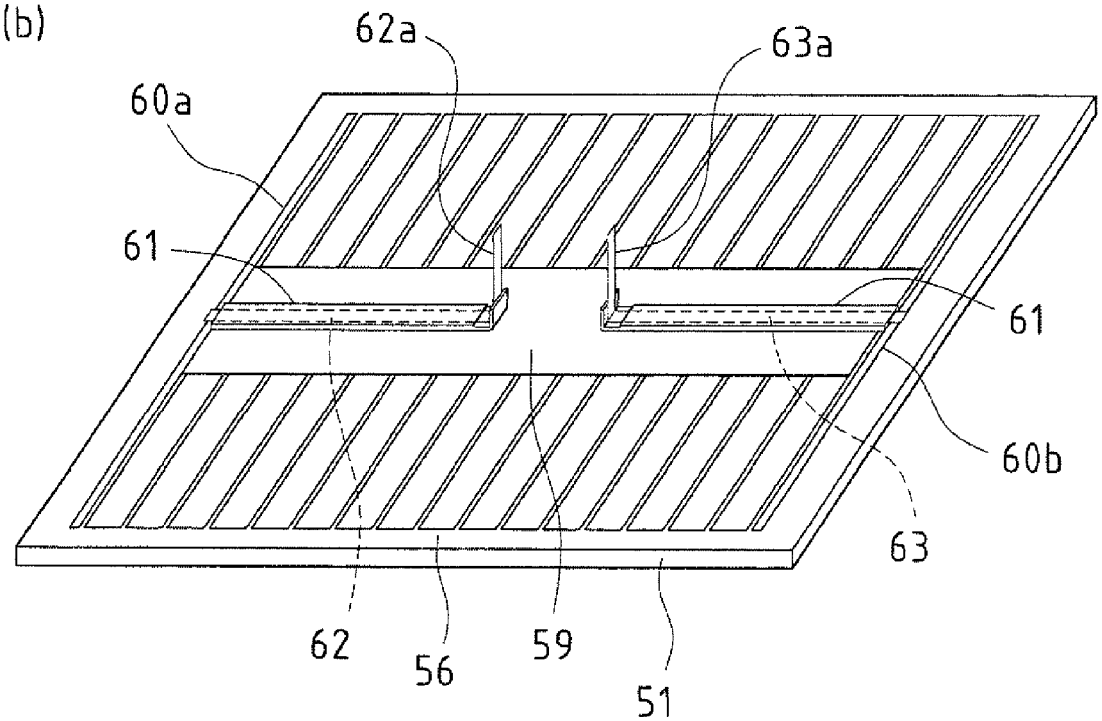
Figure 2:
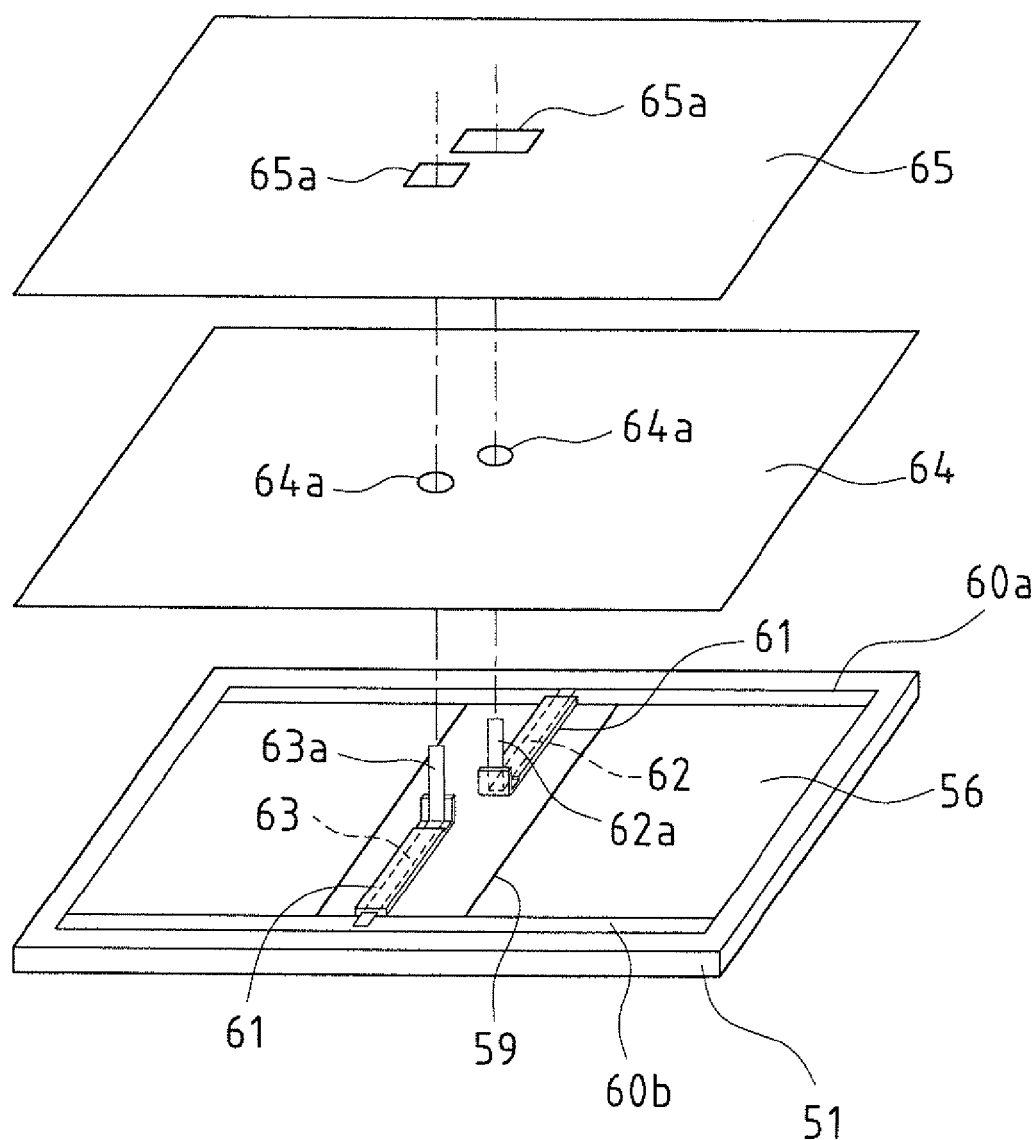
[FIG. 2]

FIGS. 1(a) and 1(b) and FIG. 2 show a solar cell module of Configuration Example 1 according to an embodiment of the present invention. FIGS. 1(a) and 1(b) are illustrative diagrams showing two scenes of a manufacturing process thereof, and FIG. 2 is an illustrative diagram showing a step of laminating and sealing a solar cell string.

A solar cell 55 is formed by laminating, although not shown in the drawings, a transparent electrode film made of a transparent conductive film, a photoelectric conversion layer and a back face electrode film in this order on a light-transmitting insulating substrate 51. The light-transmitting insulating substrate can be made of glass or a heat-resistant resin such as polyimide. The transparent electrode film can be made of $SnO_2$, ZnO, ITO or the like. The photoelectric conversion layer can be made of a silicon-based photoelectric conversion film such as amorphous silicon or microcrystalline silicon, or a compound-based photoelectric conversion film such as CdTe or $CuInSe_2$.

The solar cell 55 thus configured has, as shown in FIG. 1(a), an elongated rectangular shape with a length extending substantially across the entire width of the light-transmitting insulating substrate 51. A solar cell string 56 in which a plurality of solar cells 55 are connected in series is configured by connecting the transparent electrode film of one of each two adjacent solar cells 55 and the back face electrode film of the other solar cell to each other.

On an end of the transparent electrode film of the solar cell 55 located at one end of the solar cell string 56, a P-type electrode terminal portion 57 having a linear shape with substantially the same length as the solar cell 55 is formed, and on an end of the back face electrode film of the solar cell 55 located at the other end of the solar cell string 56, an N-type electrode terminal portion 58 having a linear shape with substantially the same length as the solar cell 55 is formed. The P-type electrode terminal portion 57 and the N-type electrode terminal portion 58 serve as electrode lead-out portions. By forming the solar cells 55 and the electrode terminal portions 57 and 58 to have the same length as described above, a current that has flowed through the solar cells 55 of the solar cell string 56 in series can be extracted uniformly without local concentration of the current, and it is therefore possible to suppress the occurrence of series resistance losses.

A positive electrode current collecting portion 60*a* called bus bar and made of a copper foil having substantially the same shape and size as the P-type electrode terminal portion 57 is electrically and mechanically bonded to the entire face of the P-type electrode terminal portion 57, and a negative electrode current collecting portion 60*b* having the same shape and size as the N-type electrode terminal portion 58 is electrically and mechanically bonded to the entire face of the N-type electrode terminal portion 58. As a means for bonding these, soldering or a conductive paste can be used, for example.

In the configuration described above, a positive electrode lead wire 62 and a negative electrode lead wire 63 that are made of flat cables and covered with an insulating film 61 are disposed in line (or parallel, i.e., disposed offset in the width direction), with their tips opposing each other, on the solar cell string 56 via an EVA sheet 59 disposed for bonding. It should be noted that the EVA sheet 59 for bonding is not necessarily required.

One end of the positive electrode lead wire 62 is connected to a center position of the positive electrode current collecting portion 60*a*, and the other end is located in a substantially center area of the solar cell string 56 and is bent at a predetermined angle (perpendicularly in FIGS. 1 and 2) with respect to the face of the solar cell string 56 to serve as an output lead portion 62*a*. Likewise, one end of the negative electrode lead wire 63 is connected to a center position of the negative electrode current collecting portion 60*b*, and the other end is located in a substantially center area of the solar cell string 56 and is bent at a predetermined angle (perpendicularly in FIGS. 1 and 2) with respect to the face of the solar cell string 56 to serve as an output lead portion 63*a*. The bending angle (predetermined angle) of the output lead portions 62*a* and 63*a* is not necessarily limited to the perpendicular direction because it is related to the shape of a terminal box (not shown), but FIGS. 1 and 2 will be described in the context of the output lead portions being bent perpendicularly.

Figure 3:
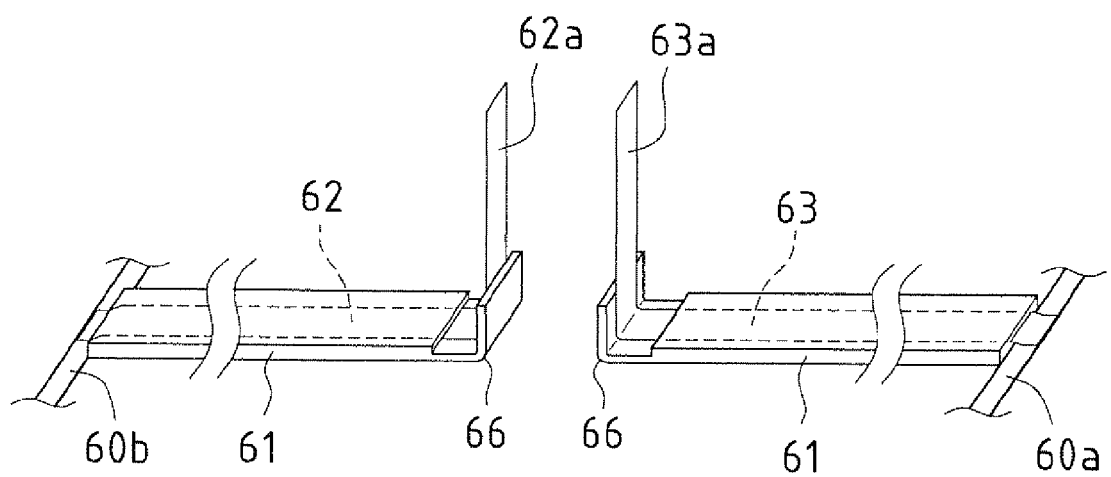
[FIG. 3]

FIG. 3 is a partially enlarged perspective view showing the periphery of the output lead portions 62*a* and 63*a*.

In the present embodiment, in the output lead portions 62*a* and 63*a*, a tip-side portion of the lead wire including a bent portion 66 is covered on one side with an insulating film 61. More specifically, the insulating film 61 covering such a portion is provided on the lead wires 62*a* and 63*a* on the side of the back face electrode film of the solar cell string 56. In other words, when the output lead portions 62*a* and 63*a* are bent at the root portions thereof in order to perpendicularly raise the output lead portions 62*a* and 63*a*, because, in those portions, the insulating film 61 is provided only on one side of each lead wire 62, 63, and thus the stiffness and resilience provided by the insulating film 61 are low, they can be bent perpendicularly with ease.

The positive electrode lead wire 62 and the negative electrode lead wire 63 are made of the same material (namely, a copper foil) as that of the positive electrode current collecting portion 60*a* and the negative electrode current collecting portion 60*b*. As a means for bonding the lead wires and the current collecting portions, soldering, spot welding or the like can be used. Although the positive electrode lead wire 62 and the negative electrode lead wire 63 extend across a plurality of solar cells 55, because the lead wires 62 and 63 are entirely covered with the insulating film 61, the solar cells 55 will not be short-circuited.

In this state, as shown in FIG. 2, a sealing insulating film 64 and a back film 65 serving as a back face protection sheet for weather resistance and high insulation are laminated and sealed on the entire face of the solar cell string 56, with the output lead portions 62*a* and 63*a* of the positive electrode lead wire 62 and the negative electrode lead wire 63 passing through openings 64*a* and 65*a*. The sealing insulating film 64 can be any film as long as it has good adhesion to the back film 65, the insulating film 61 and the solar cells 55 and superior long-term weather resistance, such as PVB or silicone, but in particular, it is optimal to use a film made of EVA (ethylene vinyl acetate resin) because it has shown satisfactory performance as a film for solar cells. In particular, by selecting films having good adhesion to each other as the sealing insulating film 64 and the insulating film 61, the water resistance of the solar cell string can be improved. The back film 65 is preferably a three-layer structure film including a moisture resistant layer such as a PET/Al/PET film (PET: polyethylene terephthalate). As for the thicknesses of these films, for example, when the insulating film 61 has a thickness of 50 μm and the sealing insulating film 64 has a thickness of 600 μm, the back film 65 has a thickness of 100 μm.

In the solar cell string 56 thus configured, a terminal box 10 (not shown) is attached and electrically connected to the output lead portions 62*a* and 63*a* of the positive electrode lead wire 62 and the negative electrode lead wire 63 protruding upward from the openings 65*a* of the back film 65.

The electrode arrangement in the solar cell string 56 is merely exemplary, and the arrangement is not limited thereto. For example, the positive electrode lead wire 62 and the negative electrode lead wire 63 may be disposed at a position closer to one of the ends of the solar cell string 56, rather than the center area of the solar cell string 56, and the lead wires may not necessarily be drawn out to the center area. In other words, the positive electrode lead wire 62 and the negative electrode lead wire 63 may be disposed such that the output lead portions 62*a* and 63*a* protrude upward from near the positive electrode current collecting portion 60*a* and the negative electrode current collecting portion 60*b*.

Description of Solar Cell Module of Configuration Example 2

Figure 4:
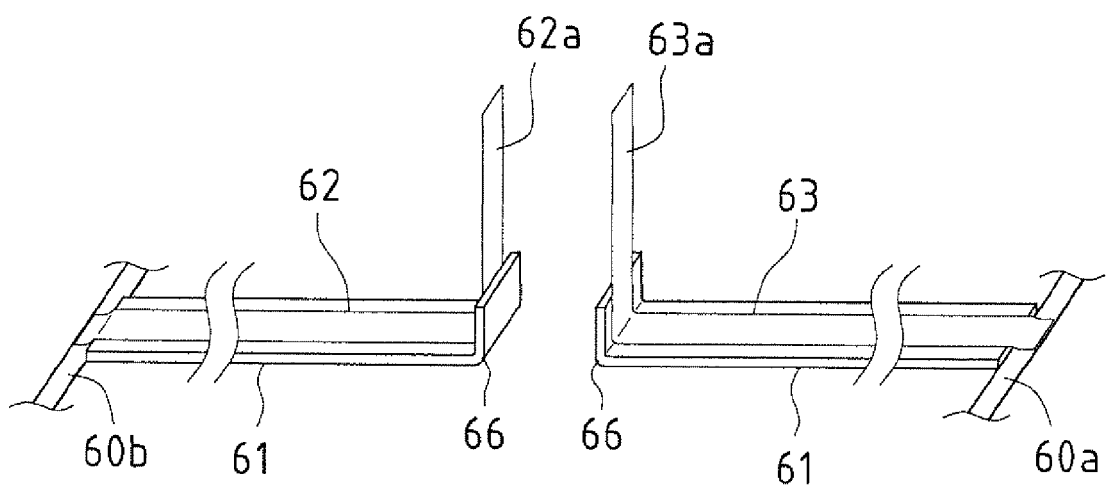
[FIG. 4]

In the solar cell string of Configuration Example 1 described above, in each lead wire 62, 63, a portion extending from the current collecting portion 60*a*, 60*b* to a position short of the bent portion 66 is entirely covered with the insulating film 61, and the tip-side portion of the output lead portion 62*a*, 63*a* including the bent portion 66 is covered on one side with the insulating film 61. In Configuration Example 2, as shown in FIG. 4, the entire portion extending from the current collecting portion 60*a*, 60*b* to the tip-side portion of the output lead portion 62*a*, 63*a* including the bent portion 66 is covered on one side with the insulating film 61. More specifically, the insulating film 61 is provided on each lead wire 62, 63 on the side of the back face electrode film of the solar cell string 56. In other words, when the output lead portions 62*a* and 63*a* are bent at the root portions thereof in order to perpendicularly raise the output lead portions 62*a* and 63*a*, because, in those portions, the insulating film 61 is provided only on one side of each lead wire 62, 63, and thus stiffness and resilience provided by the insulating film 61 are low, they can be bent perpendicularly with ease. In addition, by providing the insulating film 61 only on one side so as to extend substantially along the entire length of each lead wire 62, 63, the amount of use of the insulating film can be reduced to the required minimum, leading to a reduction in the cost of components.

Description of Dielectric Strength Structure of Solar Cell Module

In the present embodiment, in the solar cell module configured as described above, an insulating sheet is disposed between the back face electrode film of the solar cell 55 and the back film 65 so as to cover the entire perimeter of the edge of the opening 65a of the back film 65, so that a dielectric strength between the end face of the Al layer exposed at the end face of the opening 65a of the back film 65 and the back face electrode film can be ensured. In other words, a method of manufacturing a solar cell module according to the present embodiment includes, in a step of laminating a solar cell 55 composed of a transparent electrode film, a photoelectric conversion layer and a back face electrode film on a light-transmitting insulating substrate 51, and sequentially laminating, on the back face electrode film of the solar cell 55, an insulated lead wire 62, 63, and a back film 65 having an opening 65a for drawing out an output lead portion 62a, 63a of the lead wire 62, 63, a step of disposing an insulating sheet between the back face electrode film and the back film 65 so as to cover the entire perimeter of the edge of the opening 65a of the back film 65.

It is sufficient that the insulating sheet is disposed so as to extend at least along the entire perimeter of the edge of the opening 65a of the back film 65. In the present embodiment, because the opening 65a is rectangular, in the case where an insulating sheet having, for example, an elongated tape-like shape (rectangular shape) is used, four such tape-like insulating sheets may be disposed, one along each edge of the rectangular opening 65a, so as to form a quadrangular shape having four sides. Hereinafter, specific examples of the shape and arrangement of the insulating sheet will be described.

SPECIFIC EXAMPLE 1

Figure 5:
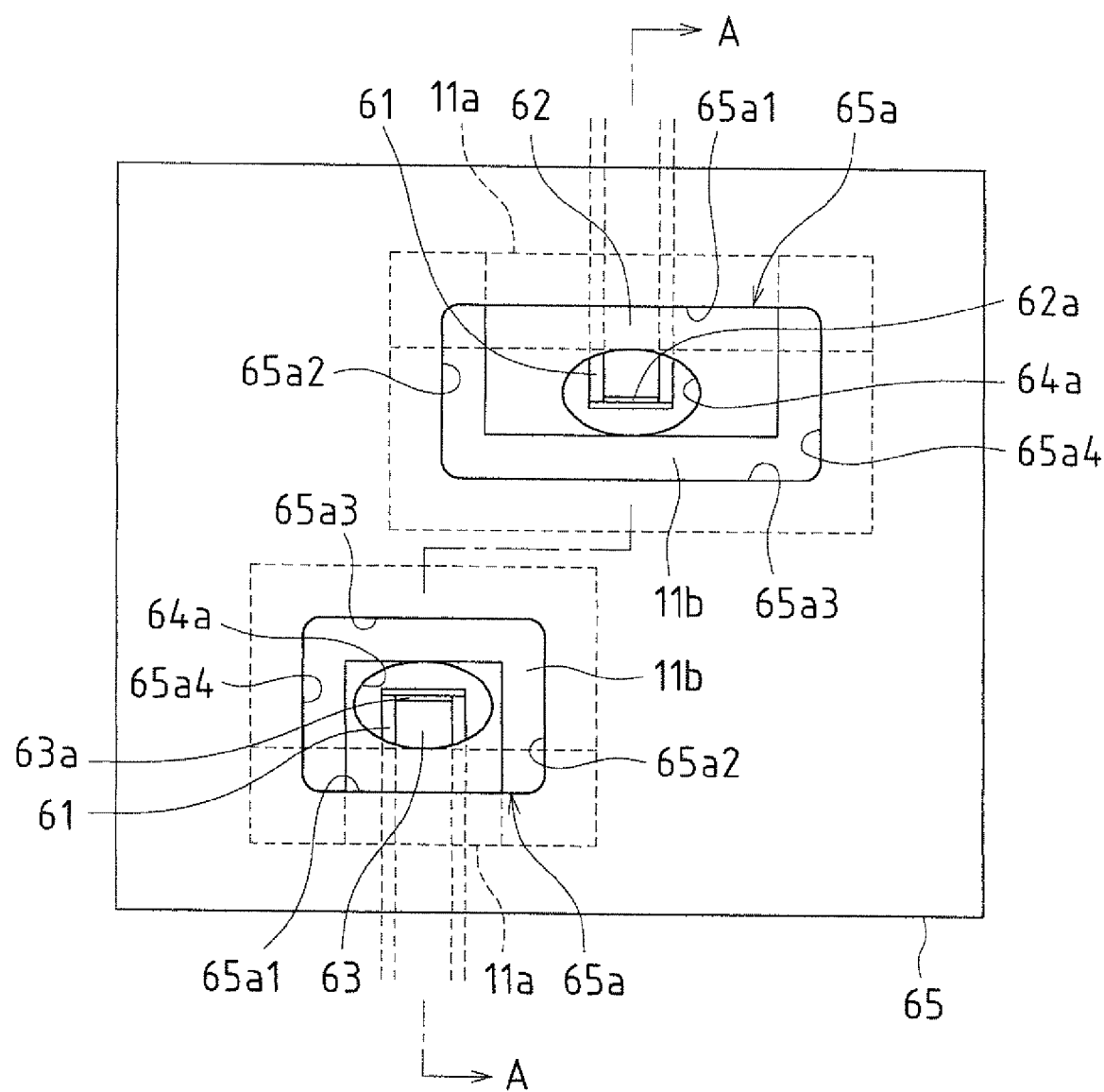
[FIG. 5]
Figure 6:
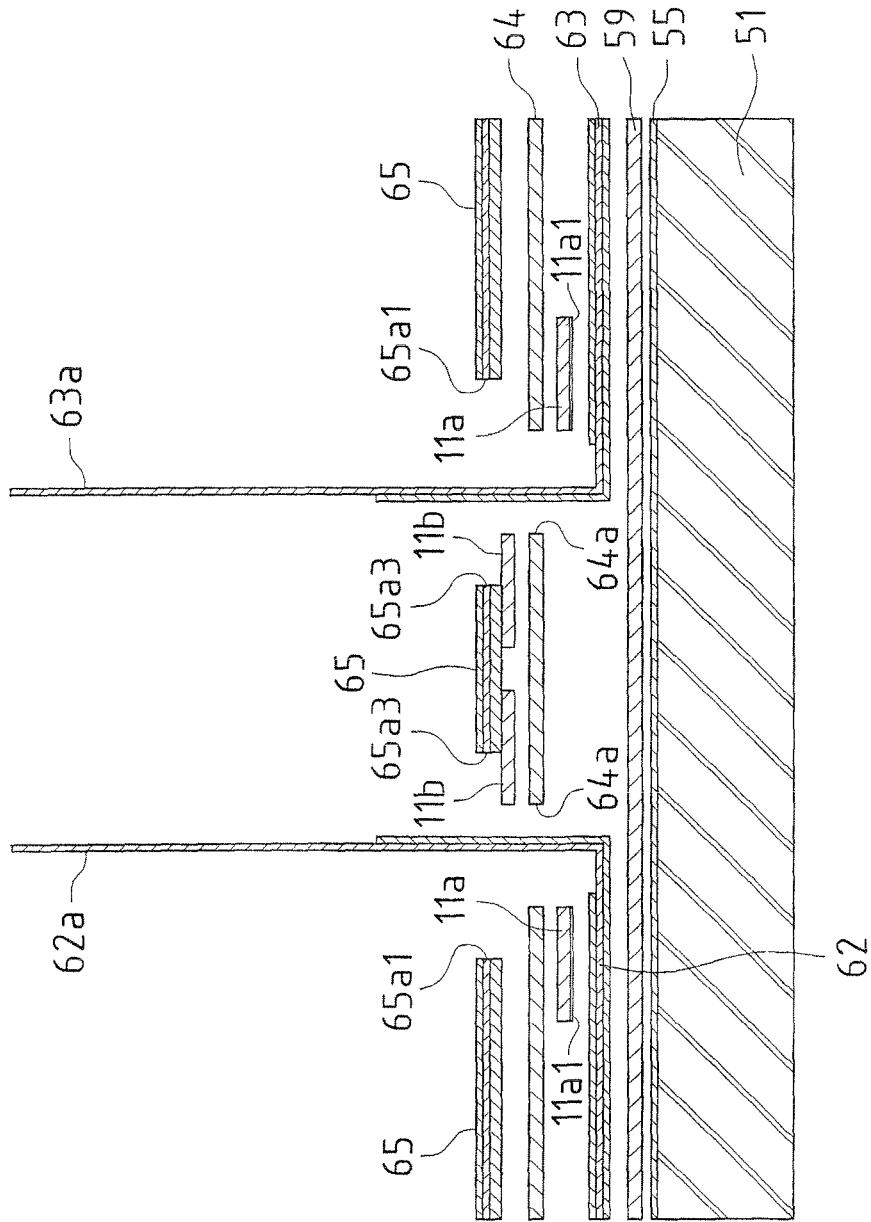
[FIG. 6]

FIG. 5 is a plan view of the periphery of openings for showing the shape and arrangement of an insulating sheet of Specific Example 1, and FIG. 6 is a cross-sectional view taken along the line A-A shown in FIG. 5 (precisely, an end view). Here, two openings 65a are formed so as to correspond to the output lead portions 62a and 63a of the lead wires 62 and 63, but the shape and arrangement of the insulating sheet are the same, and thus only one of the openings (the opening 65a on the right side of FIG. 6) will be described here.

The insulating sheet of Specific Example 1 is composed of an insulating sheet 11a having a rectangular shape and disposed along one side edge 65a1 of the opening 65a across which the lead wire 63 extends and another insulating sheet 11b disposed in a U shape along three side edges 65a2 to 65a4 across which the lead wire 63 does not extend.

The insulating sheet 11a is disposed between the lead wire 63 and the sealing insulating film (for example, an EVA sheet) 64, and the insulating sheet lib is disposed between the sealing insulating film 64 and the back film 65. In other words, the insulating sheet 11a is disposed below the sealing insulating film 64, and the insulating sheet 11b is disposed above the sealing insulating film 64.

The insulating sheet 11a is a sticky sheet in which a sticky agent 11a1 has been applied to the underside thereof, and when the insulating sheet 11a is disposed on the back face electrode film of the solar cell 55 so as to extend along the edge 65a1 of the opening 65a of the back film 65, the lead wire 63 is fixed or temporarily fixed onto the EVA sheet 59. In other words, the insulating sheet 11a provides insulation to the edge 65a1 of the opening 65a as well as fixing the lead wire 63. The insulating sheet 11atherefore will not shift out of position relative to the edge 65a1 of the opening 65a in subsequent laminate processing and fix or temporarily fix the lead wire 63 such that the lead wire 63 will not shift out of position. In other words, the lead wire 63 can be reliably disposed and fixed in a position in which the lead wire 63 is not in contact with the end face of the opening 65a of the back film 65.

On the other hand, the insulating sheet 11b is disposed so as to extend along the other three side edges 65a2 to 65a4 of the opening 65a of the back film 65, and is fixed or temporarily fixed to the underside of the edges 65a2 to 65a4 using an adhesive. Therefore, the insulating sheet 11b will not shift out of position relative to the three side edges 65a2 to 65a4 of the opening 65a in subsequent laminate processing.

Accordingly, in such a state, by subjecting the whole to laminate processing, the insulating sheets 11a and 11b are reliably disposed between the back face electrode film of the solar cell 55 and the back film 65, completely covering the entire perimeter of the edge of the opening 65a of the back film 65.

SPECIFIC EXAMPLE 2

Figure 7:
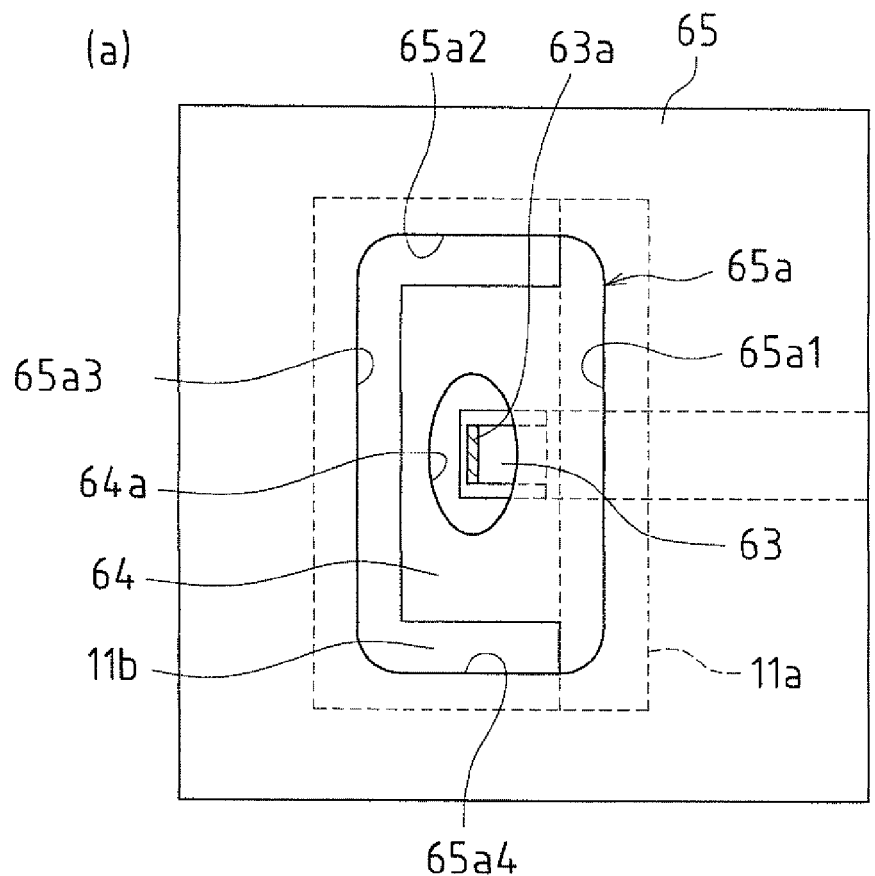
[FIG. 7]
Figure 7:
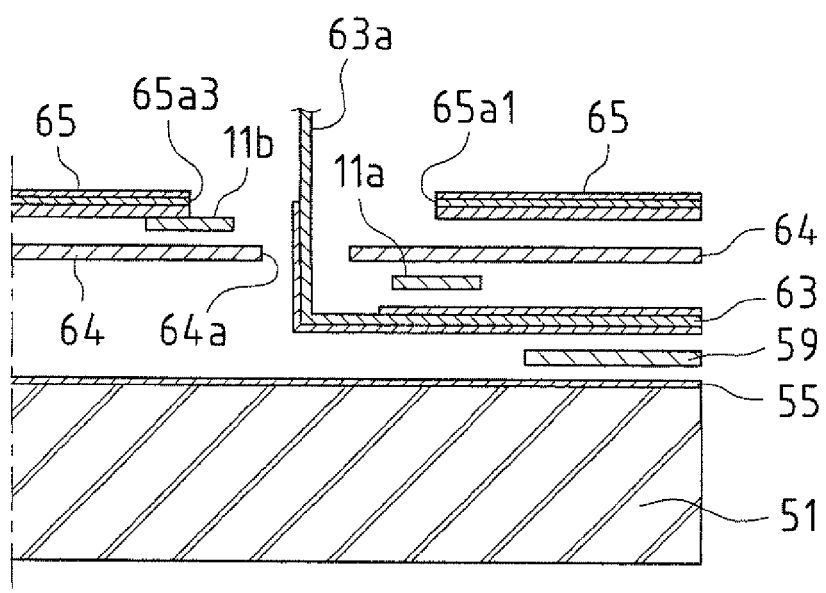

FIGS. 7(a) and 7(b) are a plan view and a cross-sectional view (precisely, an end view) of the periphery of an opening, for showing the shape and arrangement of an insulating sheet of Specific Example 2. FIGS. 7 show an example in the case of application to the solar cell module configured as shown in FIG. 3 (specifically, the solar cell module in which the lead wires 62 and 63 are covered on both sides). FIGS. 7 show only one opening 65a, namely, the opening 65a through which the output lead portion 63a of the lead wire 63 is drawn out, but the other opening 65a through which the output lead portion 62a of the other lead wire is drawn out has the same structure.

Specific Example 2 and Specific Example 1 described above are different in that in Specific Example 1, the EVA sheet 59 is disposed on the entire back face electrode film of the solar cell 55, whereas in Specific Example 2, the EVA sheet 59 is disposed so as to extend only up to a position short of the opening 65a of the back film 65. The other configurations are the same as those of Specific Example 1. Accordingly, in this case, when the insulating sheet 11a is disposed on the back face electrode film of the solar cell 55 so as to extend along the edge 65a1 of the opening 65a of the back film 65, the lead wire 63 is fixed or temporarily fixed directly onto the back face electrode film.

SPECIFIC EXAMPLE 3

Figure 8:
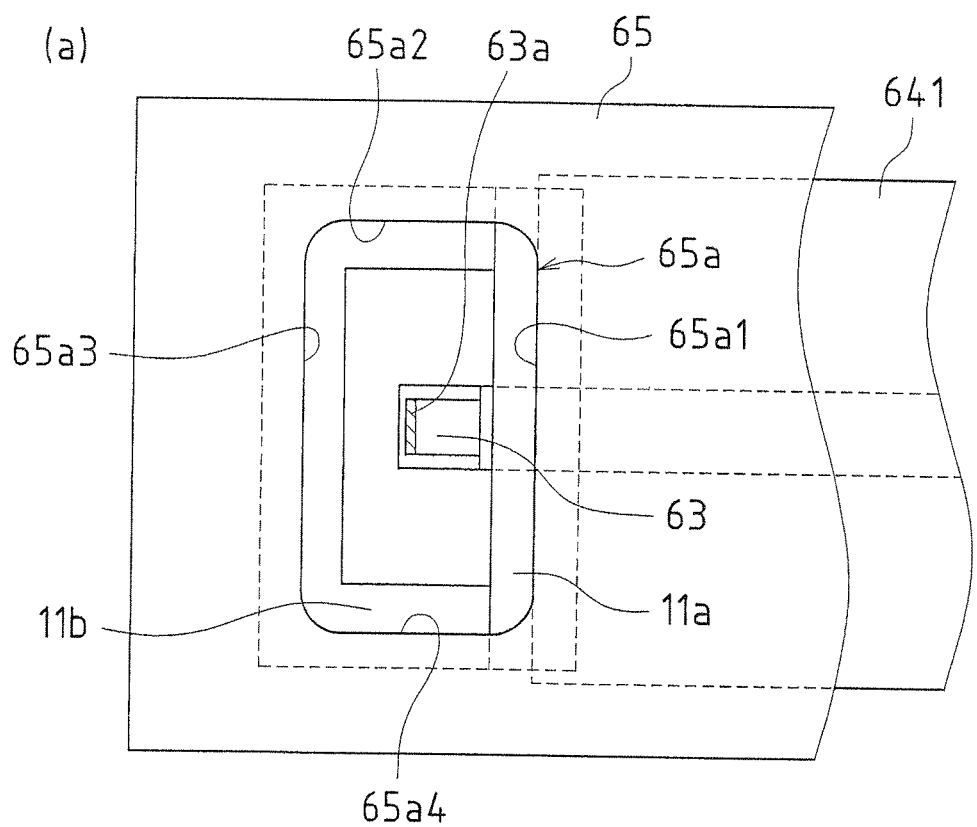
[FIG. 8]
Figure 8:
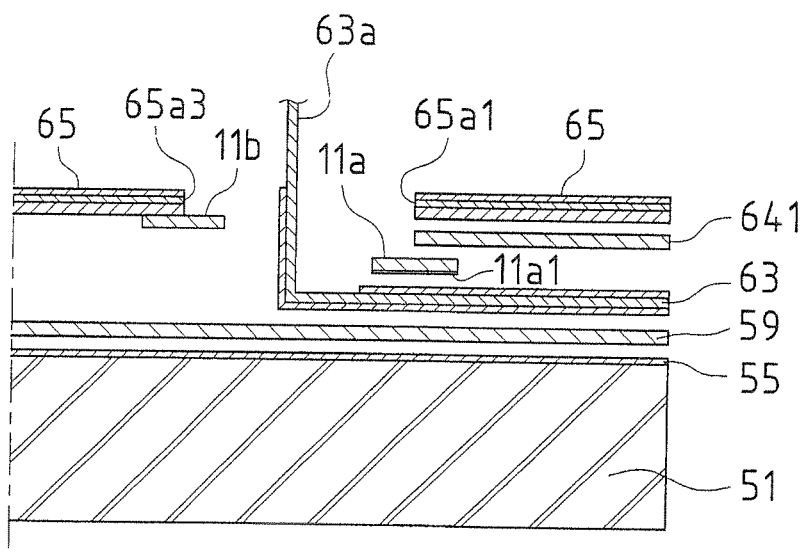

FIGS. 8(a) and 8(b) are a plan view and a cross-sectional view (precisely, an end view) of the periphery of an opening, for showing the shape and arrangement of an insulating sheet of Specific Example 3. FIGS. 8 show an example in the case of application to the solar cell module configured as shown in FIG. 3 (specifically, the solar cell module in which the lead wires 62 and 63 are covered on both sides). Also, FIGS. 8 show only one opening 65a, namely, the opening 65a through which the output lead portion 63a of the lead wire 63 is drawn out, but the other opening 65a through which the output lead portion 62a of the other lead wire is drawn out has the same structure.

Specific Example 3 and Specific Example 1 described above are different in that in Specific Example 1, the sealing insulating film 64 is formed to have the same size as that of the back film 65, whereas in Specific Example 3, instead of the sealing insulating film 64, a lead wire bonding sheet piece 641 having a width slightly greater than the width of the opening 65a of the back film 65 is disposed so as to extend along the lead wire 63. The other configurations are substantially the same as those of Specific Example 1 described above. Accordingly, in this case, the lead wire 63 is fixed or temporarily fixed onto the EVA sheet 59 by the rectangular insulating sheet 11a and the lead wire bonding sheet piece 641. In Specific Example 3, because the lead wire 63 can be fixed or temporarily fixed onto the EVA sheet 59 by the lead wire bonding sheet piece 641, the insulating sheet 11a, which is disposed so as to extend along one side edge 65a1 of the opening 65a of the back film 65, may be fixed or temporarily fixed to the underside of the lead wire bonding sheet piece 641 extending to the side edge 65a1 of the opening 65.

SPECIFIC EXAMPLE 4

Figure 9:
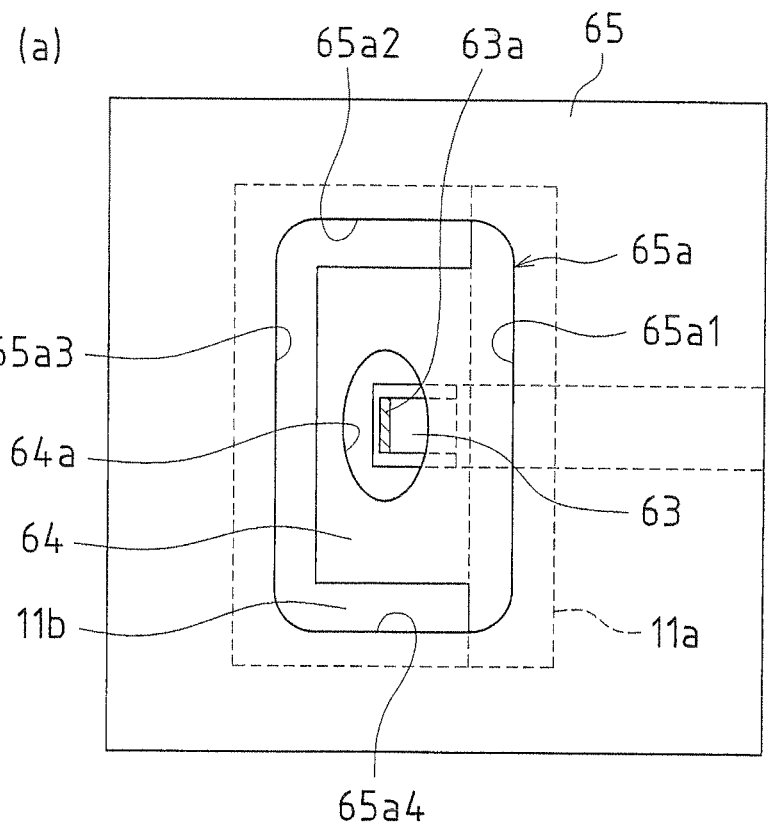
[FIG. 9]
Figure 9:
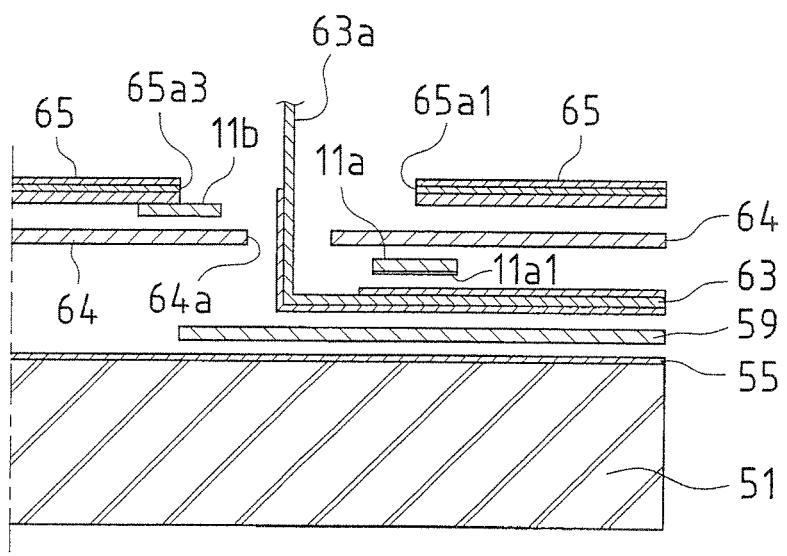

FIGS. 9(a) and 9(b) are a plan view and a cross-sectional view (precisely, an end view) of the periphery of an opening, for showing the shape and arrangement of an insulating sheet of Specific Example 4. FIGS. 9 show an example in the case of application to the solar cell module configured as shown in FIG. 3 (specifically, the solar cell module in which the lead wires 62 and 63 are covered on both sides). Also, FIGS. 9 show only one opening 65a, namely, the opening 65a through which the output lead portion 63a of the lead wire 63 is drawn out, but the other opening 65a through which the output lead portion 62a of the other lead wire is drawn out has the same structure.

Specific Example 4 and Specific Example 1 described above are different in that in Specific Example 1, the EVA sheet 59 is disposed on the entire back face electrode film of the solar cell 55, whereas in Specific Example 4, the EVA sheet 59 is disposed so as to extend only up to the opposing edge of the opening 65a of the back film 65, and also in that in Specific Example 1, the opening 64a of the sealing insulating film 64 and the opening 65a of the back film 65 have the same size, whereas in Specific Example 4, the opening 64a of the sealing insulating film 64 is smaller than the opening 65a of the back film 65. The other configurations are the same as those of Specific Example 1. In other words, the sealing insulating film 64 extends into the opening 65a of the back film 65. Accordingly, in this case, when the insulating sheet 11a is disposed on the back face electrode film of the solar cell 55 so as to extend along the edge 65a1 of the opening 65a of the back film 65, the lead wire 63 is fixed or temporarily fixed onto the EVA sheet 59. The insulating sheet 11a, which is disposed so as to extend along the edge 65a1 of the opening 65a of the back film 65, may be fixed or temporarily fixed to the underside of the sealing insulating film 64 extending into the opening 65 using an adhesive.

SPECIFIC EXAMPLE 5

Figure 10:
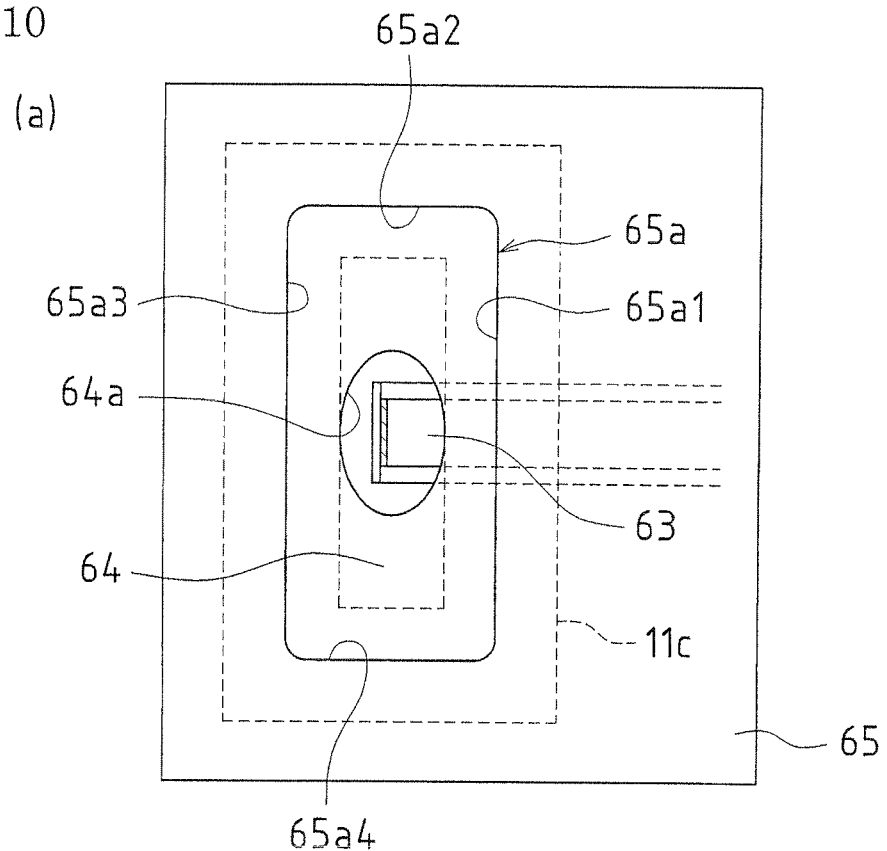
[FIG. 10]
Figure 10:
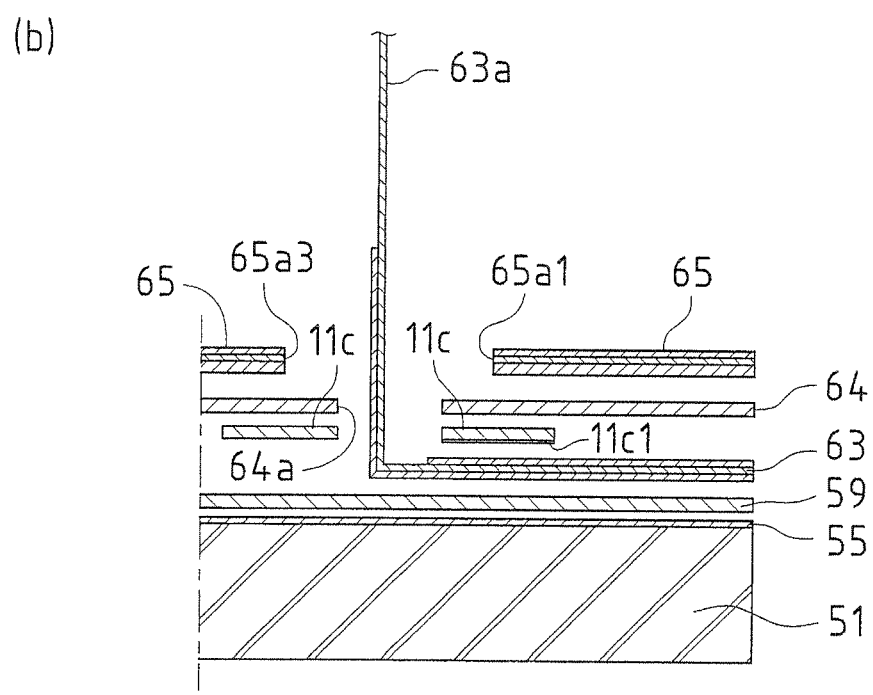

FIGS. 10(a) and 10(b) are a plan view and a cross-sectional view (precisely, an end view) of the periphery of an opening, for showing the shape and arrangement of an insulating sheet of Specific Example 5. FIGS. 10 show an example in the case of application to the solar cell module configured as shown in FIG. 3 (specifically, the solar cell module in which the lead wires 62 and 63 are covered on both sides). Also, FIGS. 10 show only one opening 65a, namely, the opening 65a through which the output lead portion 63a of the lead wire 63 is drawn out, but the other opening 65a through which the output lead portion 62a of the other lead wire is drawn out has the same structure.

In Specific Example 5, an insulating sheet 11c is composed of a single sheet having a quadrangular shape with four sides as viewed from above, so that the entire perimeter of the edge of the opening 65a of the back film 65 can be covered. The insulating sheet 11c having such a shape is disposed between the sealing insulating film 64 and the back face electrode film of the solar cell 55. However, in the present embodiment, the EVA sheet 59 for bonding is disposed between the back face electrode film of the solar cell 55 and the lead wire 63, and therefore, more precisely, the insulating sheet lie is disposed between the sealing insulating film 64 and the EVA sheet 59.

The insulating sheet 11c is a sticky sheet in which a sticky agent 11c1 has been applied to the underside thereof. When the insulating sheet 11c is disposed on the back face electrode film of the solar cell 55 (more precisely, on the EVA sheet 59) so as to extend along all of the edges 65a1 to 65a4 of the opening 65a of the back film 65, the lead wire 63 is fixed onto the back face electrode film (more precisely, onto EVA sheet 59) by the insulating sheet 11c. In other words, the insulating sheet 11c provides insulation to all of the edges 65a1 to 65a4 of the opening 65a in subsequent laminate processing and fix or temporarily fix the lead wire 63 such that the lead wire 63 will not shift out of position. The sticky agent 11c1 applied to the underside of the insulating sheet 11c may be applied only to a side portion opposing to the edge 65a1 of the opening 65a across which the lead wire 63 extends.

After the lead wire 63 has been bonded and fixed by the insulating sheet 11c in the manner described above, the whole is subjected to laminate processing, and thereby the insulating sheet 11c is disposed between the back face electrode film of the solar cell 55 and back film 65, completely covering the entire perimeter of the edge of the opening 65a of the back film 65.

SPECIFIC EXAMPLE 6

Figure 11:
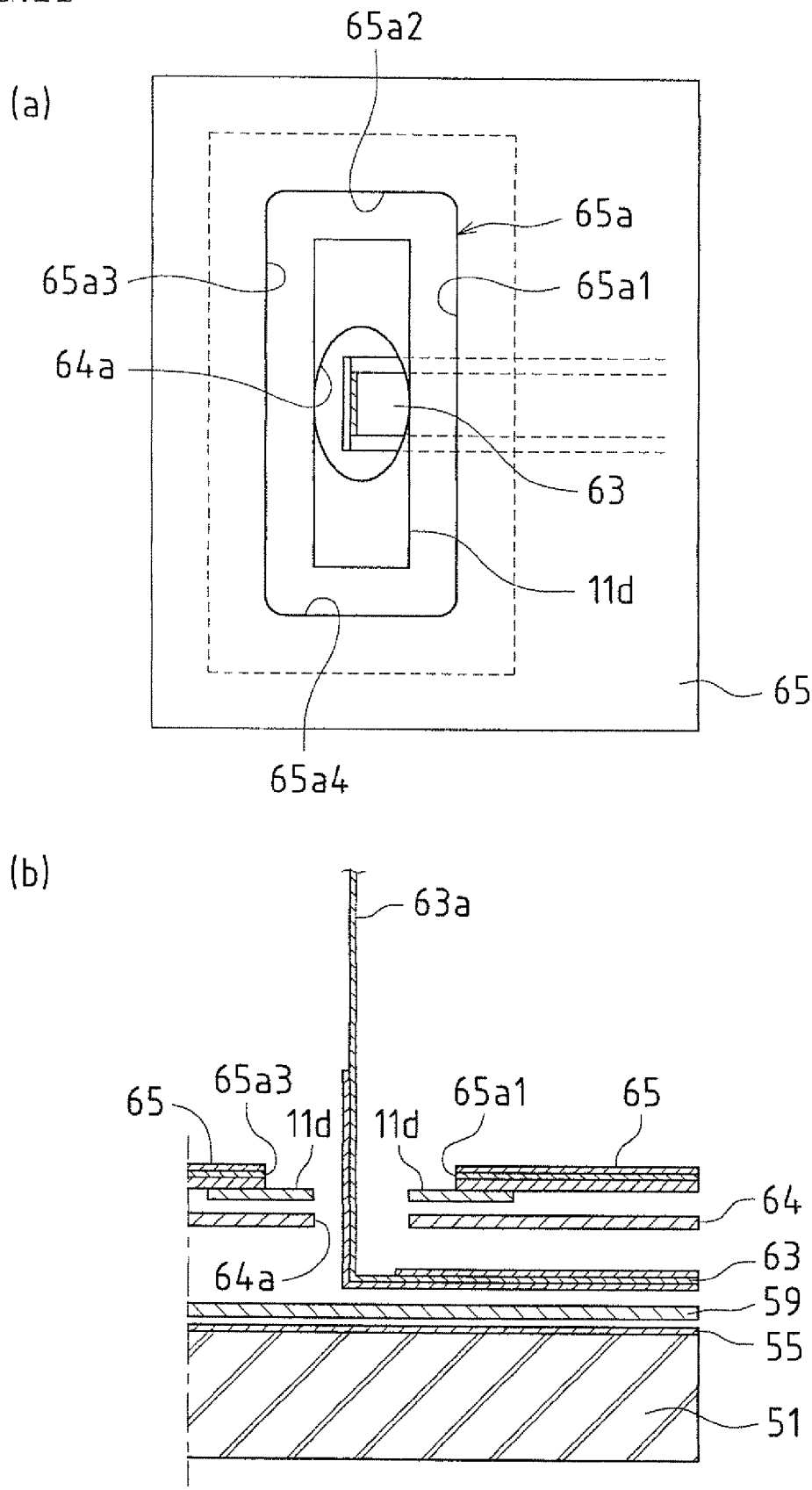
[FIG. 11]

FIG. 11 is a cross-sectional view (precisely, an end view) of the periphery of an opening, for showing the shape and arrangement of an insulating sheet of Specific Example 6. A plan view thereof is the same as that shown in FIG. 10(a).

In Specific Example 6, an insulating sheet 11d is composed of a single sheet having a quadrangular shape with four sides as viewed from above, so that the entire perimeter of the edge of the opening 65a of the back film 65 can be covered. The insulating sheet lid having such a shape is disposed between the back film 65 and the sealing insulating film 64.

A sticky agent has been applied to the outer perimeter of the upperside of the insulating sheet 11d. When the insulating sheet lid is disposed so as to conform to the entire perimeter (the edges 65a1 to 65a4) of the opening 65a of the back film 65, by positioning and affixing the insulating sheet lid from the underside of the opening 65a of the back film 65, the insulating sheet lid can be fixed or temporarily fixed to the underside of the back film 65. Therefore, the insulating sheet lid will not shift out of position relative to the entire perimeter (the edges 65a1 to 65a4) of the opening 65a in subsequent laminate processing.

After this, the whole is subjected to the laminate processing, and thereby the insulating sheet lid is disposed between the back face electrode film of the solar cell 55 and the back film 65, completely covering the entire perimeter of the edge of the opening 65a of the back film 65.

SPECIFIC EXAMPLE 7

Figure 12:
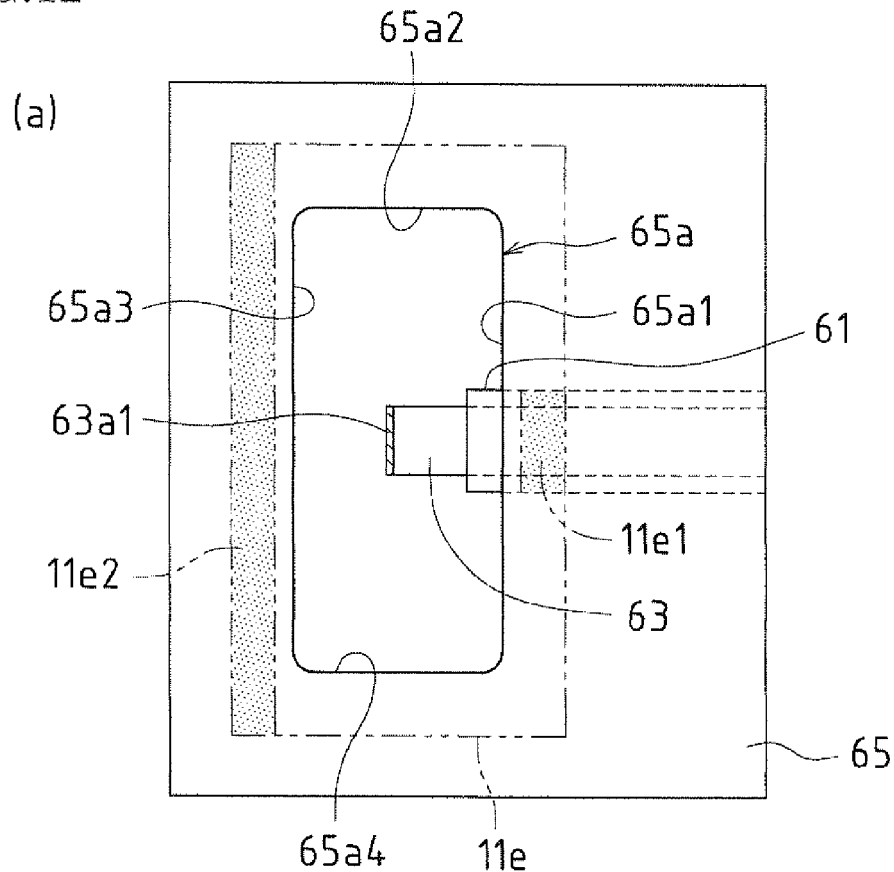
[FIG. 12]
Figure 12:
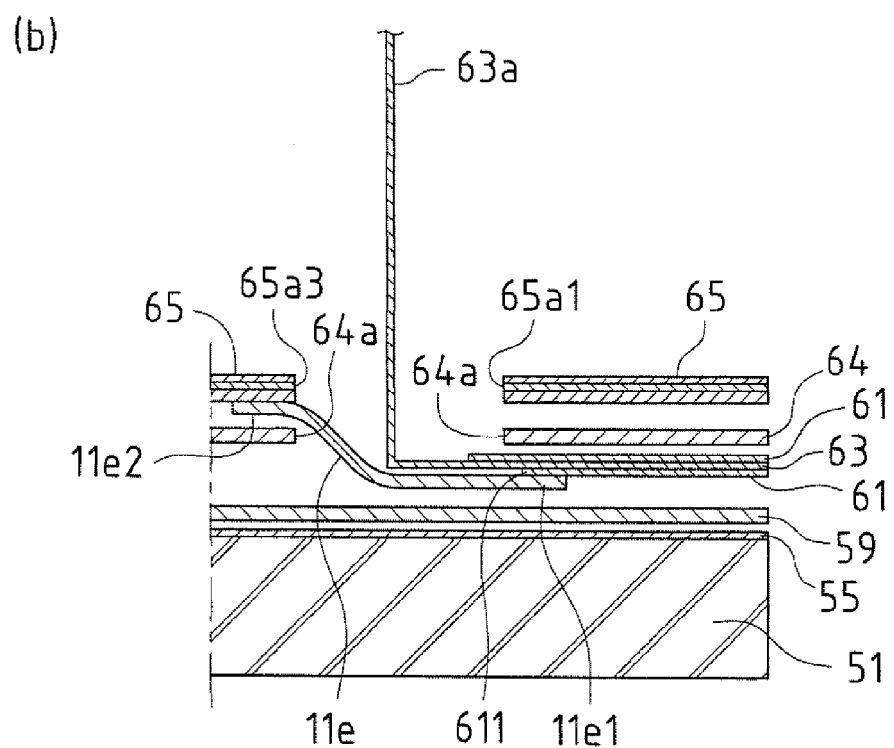

FIGS. 12(a) and 12(b) are a plan view and a cross-sectional view (precisely, an end view) of the periphery of an opening, for showing the shape and arrangement of an insulating sheet of Specific Example 7. FIGS. 12 show an example in the case of application to the solar cell module configured as shown in FIG. 3 (specifically, the solar cell module in which the lead wires 62 and 63 are covered on both sides). Also, FIGS. 12 show only one opening 65a, namely, the opening 65a through which the output lead portion 63a of the lead wire 63 is drawn out, but the other opening 65a through which the output lead portion 62a of the other lead wire is drawn out has the same structure.

In Specific Example 7, an insulating sheet 11e is formed as a single sheet (indicated by a dashed double-dotted line in FIG. 12(a)) sized to cover the entire opening 65a of the back film 65, and is disposed between the back face electrode film of the solar cell 55 and the lead wire 63 (more precisely, between the EVA sheet 59 for bonding disposed on the back face electrode film of the solar cell 55 and the lead wire 63). One edge 11e1 (the edge on the right side of the drawing) of the insulating sheet 11e is disposed so as to overlap an end 611 of the insulating film 61 disposed on the underside of the lead wire 63, and the other edge (the edge on the left side of the drawing) 11e2 of the insulating sheet 11e is bonded or adhesively fixed to the underside of an edge 65a3 of the opening 65a of the back film 65 via the opening 64a of the sealing insulating film 64.

By disposing the insulating sheet 11e between the back face electrode film of the solar cell 55 (more precisely, EVA sheet 59) and the lead wire 63 in the manner described above, it is sufficient that the covering on the underside of the lead wire 63 partially overlaps the edge 11e1 of the insulating sheet 11e, and the insulating film 61 does not necessarily extend further than that position on the lead wire 63 as shown in FIG. 3. Accordingly, when the lead wire 63 is bent and raised from the opening 65a of the back film 65, the lead wire 63 can be easily bent at any angle desired by the user because the insulating film 61 is not provided on the bent portion.

SPECIFIC EXAMPLE 8

Figure 13:
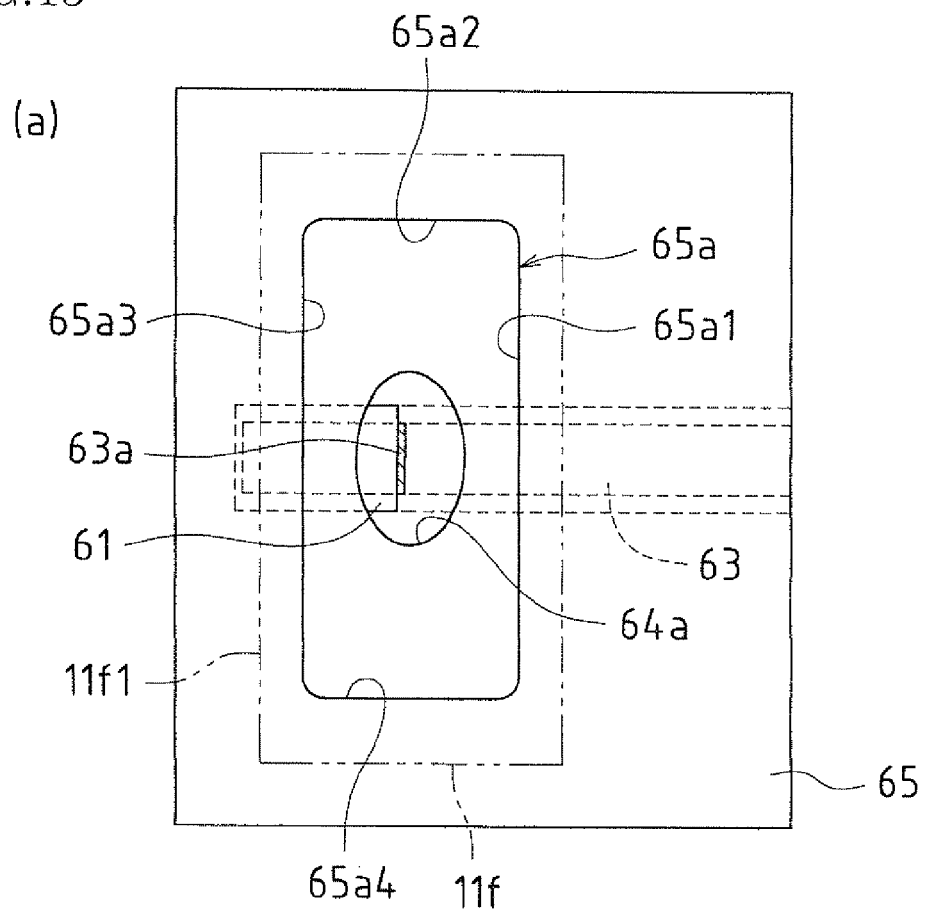
[FIG. 13]
Figure 13:
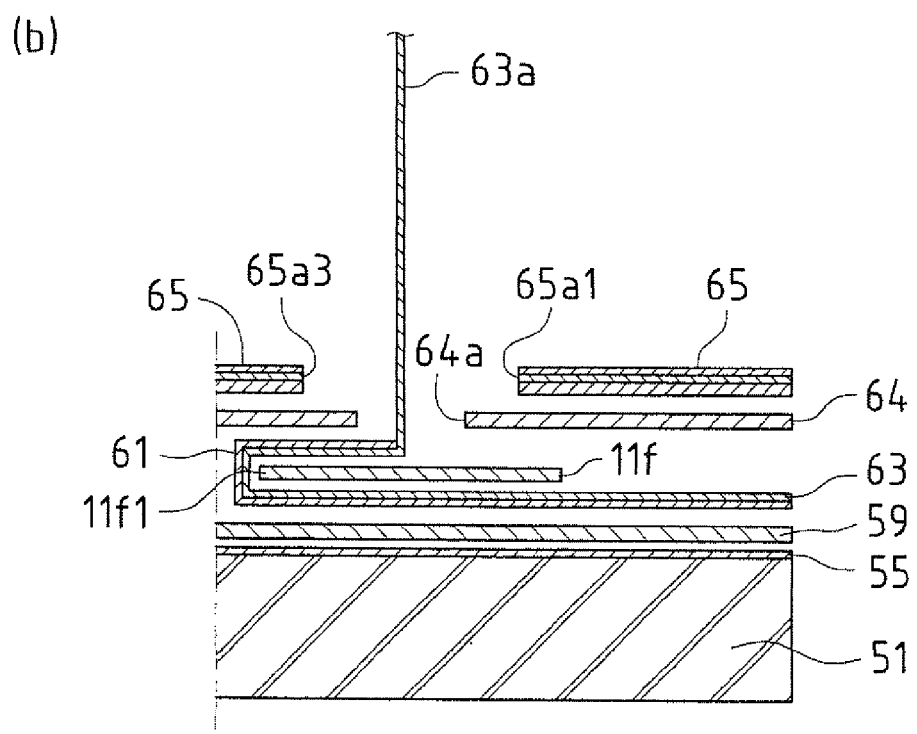

FIGS. 13(a) and 13(b) are a plan view and a cross-sectional view (precisely, an end view) of the periphery of an opening, for showing the shape and arrangement of an insulating sheet of Specific Example 8. FIGS. 13 show an example in the case of application to the solar cell module configured as shown in FIG. 4 (specifically, the solar cell module in which the lead wires 62 and 63 are covered on one side). Also, FIGS. 13 show only one opening 65a, namely, the opening 65a through which the output lead portion 63a of the lead wire 63 is drawn out, but the other opening 65a through which the output lead portion 62a of the other lead wire is drawn out has the same structure.

In Specific Example 8, an insulating sheet 11f is formed as a single sheet (indicated by a dashed double-dotted line in FIG. 13(a)) sized to cover the entire opening 65a of the back film 65, and is disposed between the lead wire 63 whose underside is covered by the insulating film 61 and whose upperside is exposed and the sealing insulating film 64.

On the other hand, the lead wire 63 is configured such that it passes under the insulating sheet 11f disposed beneath the opening 65a of the back film 65 to an end (the left end in FIG. 13(b)) 11f1 of the insulating sheet 11f, is folded over the end 11f1 so as to enfold the end 11f1, and is drawn upward from substantially the center of the opening 65a of the back film 65. With this configuration, it is sufficient that the lead wire 63 is covered only on one side by the insulating film 61 between the insulating sheet 11f and the back face electrode film of the solar cell 55, and it is unnecessary to provide the covering on the other side of the bent portion of the lead wire 63. Accordingly, the lead wire 63 can be bent easily while the insulated state by the insulating sheet 11f is maintained.

SPECIFIC EXAMPLE 9

Figure 14:
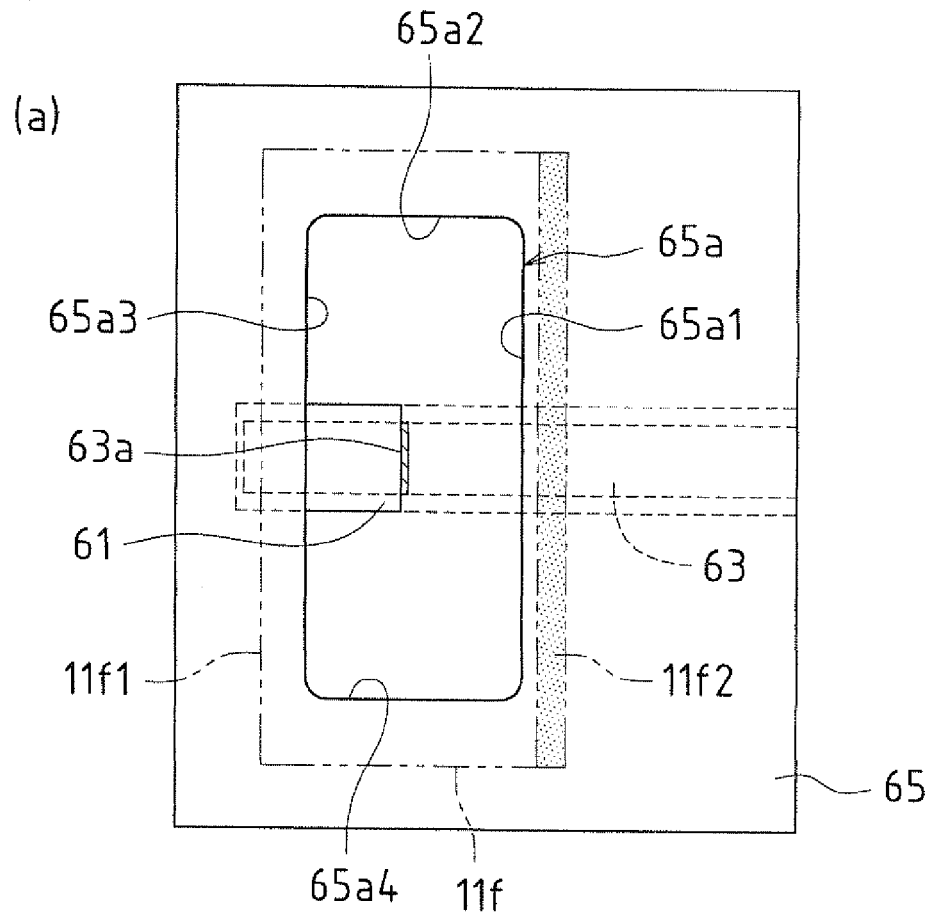
[FIG. 14]
Figure 14:
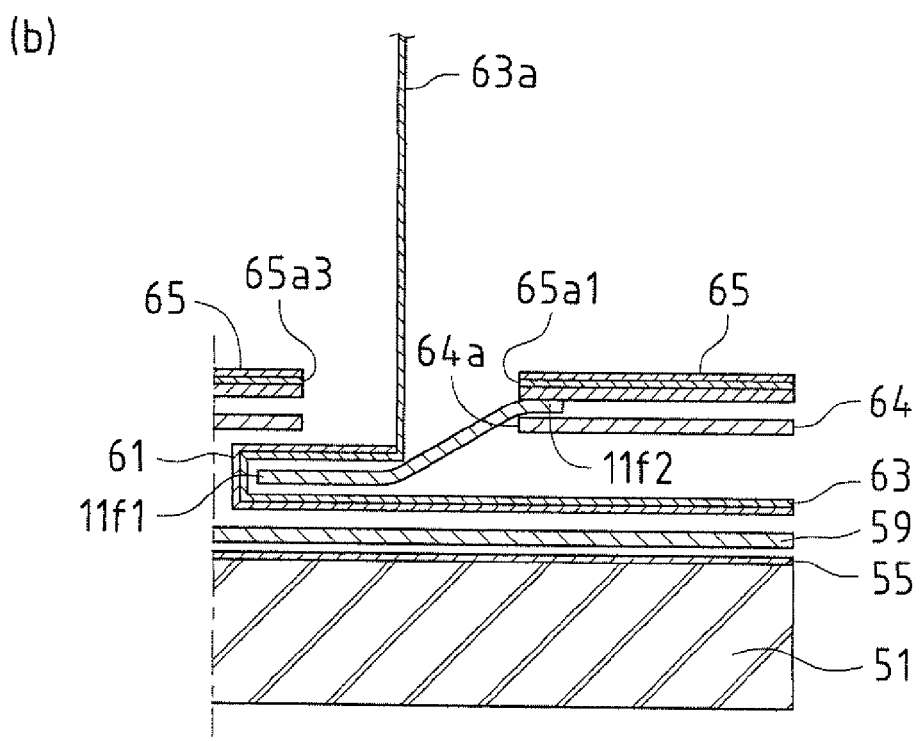

FIGS. 14(a) and 14(b) are a plan view and a cross-sectional view (precisely, an end view) of the periphery of an opening, for showing the shape and arrangement of an insulating sheet of Specific Example 9. FIGS. 14 show an example in the case of application to the solar cell module configured as shown in FIG. 4 (specifically, the solar cell module in which the lead wires 62 and 63 are covered on one side). Also, FIGS. 14 show only one opening 65a, namely, the opening 65a through which the output lead portion 63a of the lead wire 63 is drawn out, but the other opening 65a through which the output lead portion 62a of the other lead wire is drawn out has the same structure.

The configuration of Specific Example 9 is substantially the same as that of Specific Example 8 described above, except that an end 11f2 opposite to the end 11f1 of the insulating sheet 11f at which the lead wire 63 is folded is fixed or temporarily fixed to the underside of the opening 65a of the back film 65 via the opening 64a of the sealing insulating film 64, using an adhesive or the like. Therefore, the insulating sheet 11d will not shift out of position relative to the entire perimeter (the edges 65a1 to 65a4) of the opening 65a in subsequent laminate processing, and therefore insulation can be reliably provided between the end face of the Al layer exposed at the end face of the opening 65a of the back film 65 and the back face electrode film of the solar cell 55.

SPECIFIC EXAMPLE 10

Figure 15:
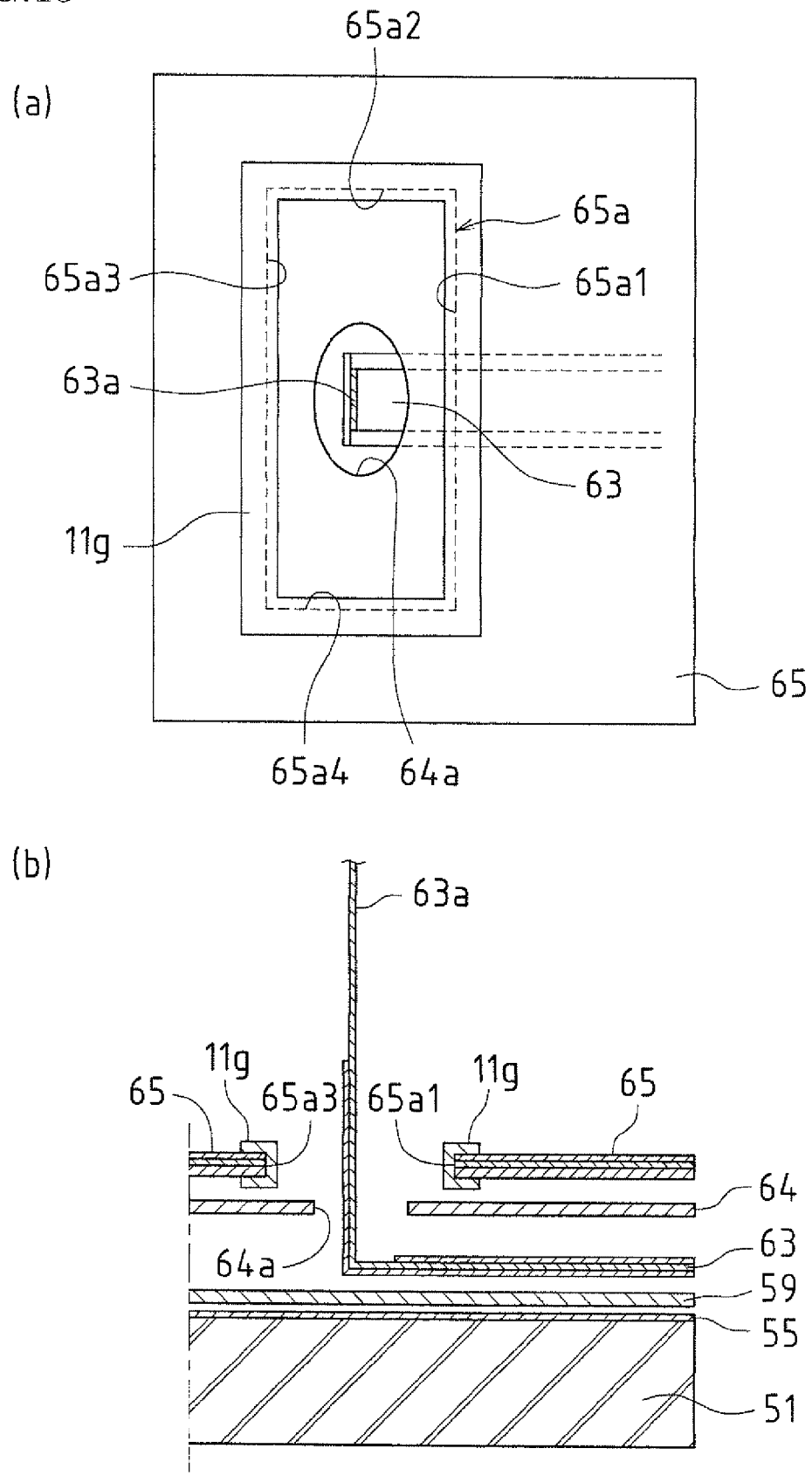
[FIG. 15]

FIGS. 15(a) and 15(b) are a plan view and a cross-sectional view (precisely, an end view) of the pheriphery of an opening, for showing the shape and arrangement of an insulating sheet of Specific Example 10. FIGS. 15 show an example in the case of application to the solar cell module configured as shown in FIG. 3 (specifically, the solar cell module in which the lead wires 62 and 63 are covered on both sides). Also, FIGS. 15 show only one opening 65a, namely, the opening 65a through which the output lead portion 63a of the lead wire 63 is drawn out, but the other opening 65a through which the output lead portion 62a of the other lead wire is drawn out has the same structure.

In Specific Example 10, an insulating sheet 11g is configured such that the end face of the opening 65a of the back film 65 is perimetrically covered directly by the insulating sheet 11g. To describe it more specifically, the insulating sheet 11g is formed in a frame shape as viewed from above having a substantially U-shaped vertical cross section, so that the underside and upperside of the edge of the opening 65a and the end face of the opening 65a can be perimetrically covered. Particularly, in order to ensure dielectric strength between the end face of the Al layer at the end face of the opening 65a and the back face electrode film of the solar cell 55, it is important that the covering of the insulating sheet 11g is provided up to the underside of the edge of the opening 65a. By directly covering the end face of the opening 65a using the insulating sheet 11g in the manner described above, an electrical discharge between the end face of the Al layer exposed at the end face of the opening 65a and the back face electrode film of the solar cell 55 can be prevented with reliability. It is therefore possible to obtain a sufficient dielectric strength without causing an electrical discharge even when a dielectric strength test at a high voltage corresponding to high voltage solar cell modules is performed.

SPECIFIC EXAMPLE 11

Figure 16:
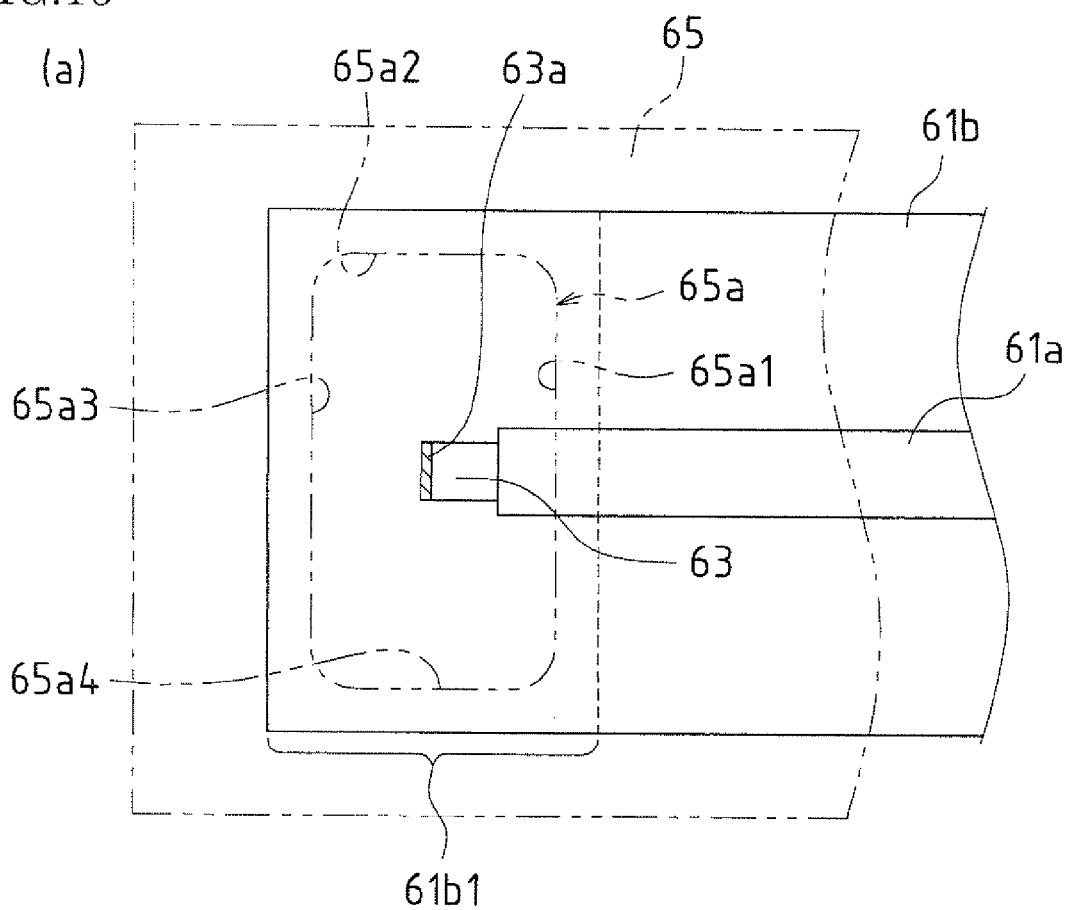
[FIG. 16]
Figure 16:
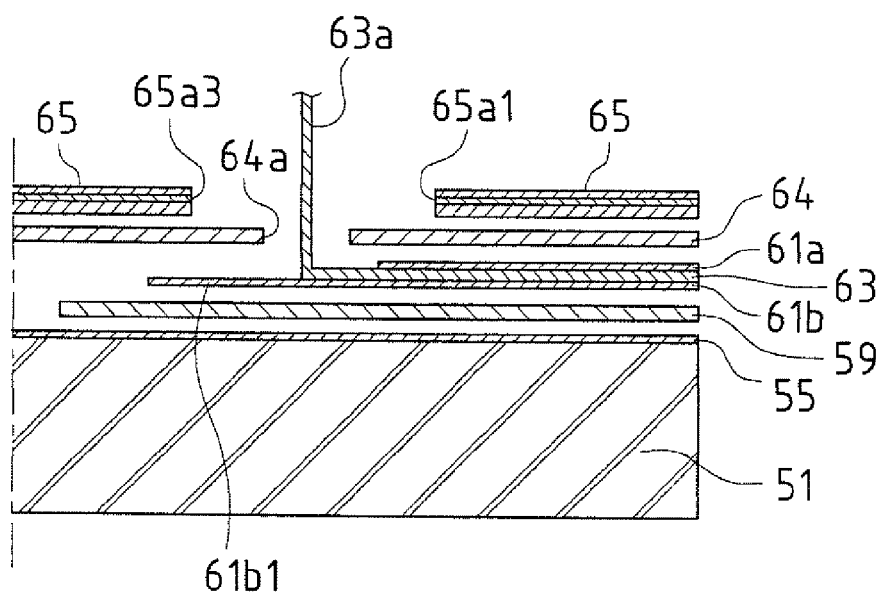

FIGS. 16(a) and 16(b) are a plan view (the back film 65 and the sealing insulating film 64 are not shown) and a cross-sectional view (precisely, an end view) of the periphery of an opening, for showing the shape and arrangement of an insulating sheet of Specific Example 11. FIGS. 16 show an example in the case of application to the solar cell module configured as shown in FIG. 3 (specifically, the solar cell module in which the lead wires 62 and 63 are covered on both sides). Also, FIGS. 16 show only one opening 65a, namely, the opening 65a through which the output lead portion 63a of the lead wire 63 is drawn out, but the other opening 65a through which the output lead portion 62a of the other lead wire is drawn out has the same structure.

In Specific Example 11, instead of separately providing an insulating sheet covering the opening 65a of the back film 65, a lower covering insulating film 61b of the lead wire 63 is used as an insulating sheet. Specifically, the lower covering insulating film 61b of the lead wire 63 is formed to have a width slightly greater than the width of the opening 65a of the back film 65 and is disposed so as to extend beyond the edge 65a3 of the opening 65a. Therefore, the entire perimeter of the edge of the opening 65a of the back film 65 can be covered by an extended portion 61b1 of the lower covering insulating film 61b.

SPECIFIC EXAMPLE 12

Figure 17:
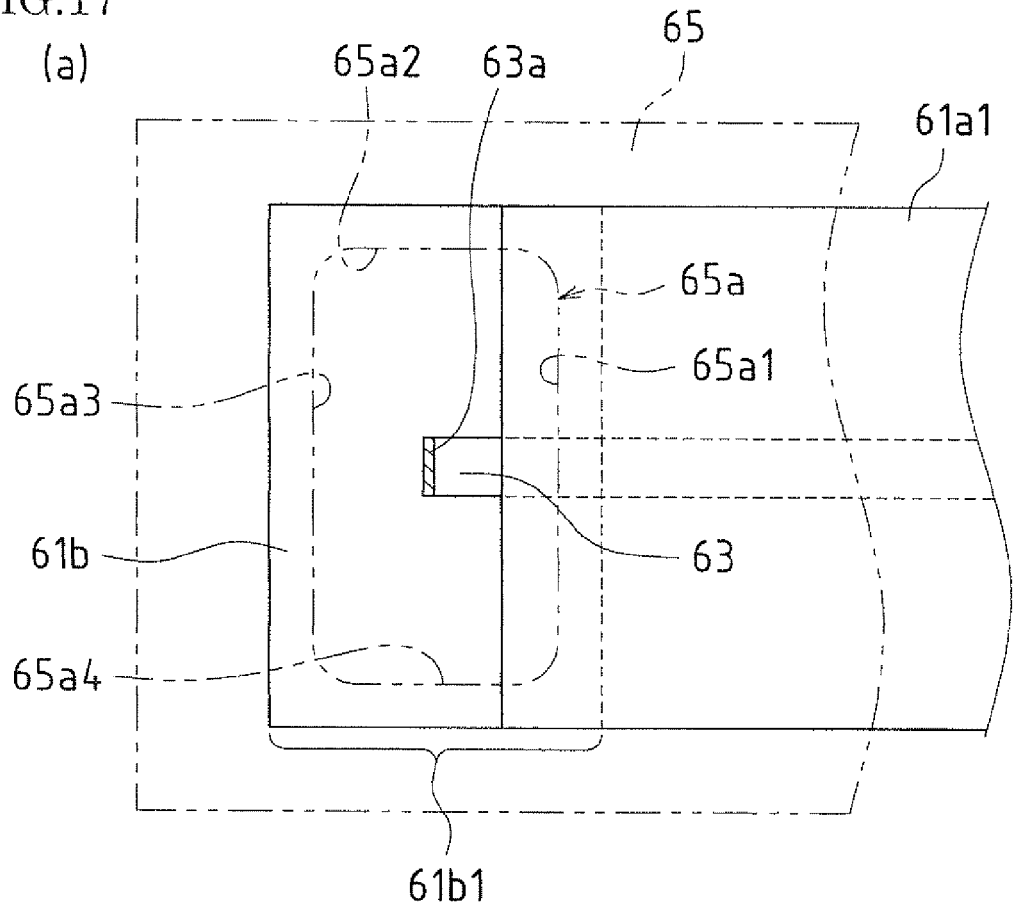
[FIG. 17]
Figure 17:
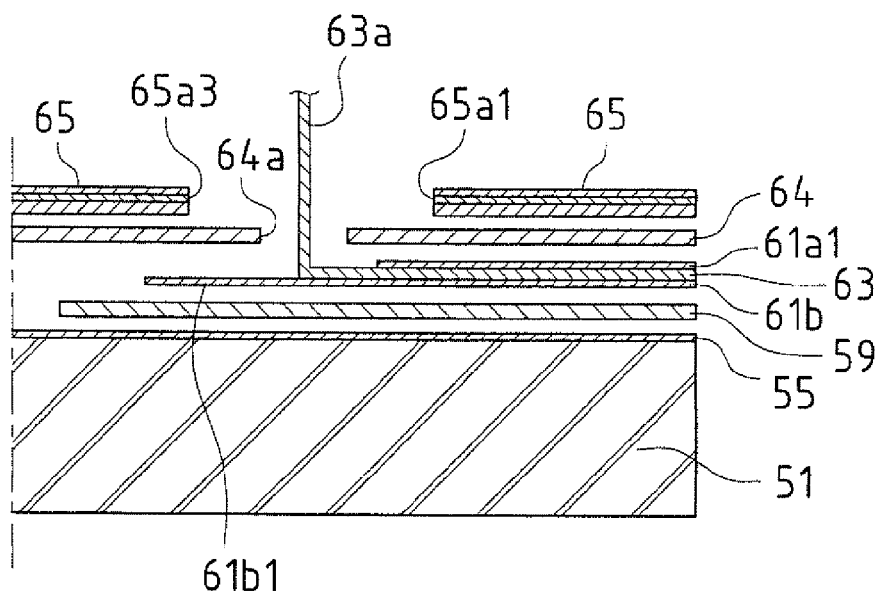

FIGS. 17(a) and 17(b) are a plan view (the back film 65 and the sealing insulating film 64 are not shown) and a cross-sectional view (precisely, an end view) of the periphery of an opening, for showing the shape and arrangement of an insulating sheet of Specific Example 12. FIGS. 17 show an example in the case of application to the solar cell module configured as shown in FIG. 3 (specifically, the solar cell module in which the lead wires 62 and 63 are covered on both sides). Also, FIGS. 17 show only one opening 65a, namely, the opening 65a through which the output lead portion 63a of the lead wire 63 is drawn out, but the other opening 65a through which the output lead portion 62a of the other lead wire is drawn out has the same structure.

Specific Example 12 and Specific Example 11 described above are different in that in Specific Example 11, only the lower covering insulating film 61b of the lead wire 63 is formed to have a width slightly greater than that of the opening 65a of the back film 65, whereas in Specific Example 12, the upper covering insulating film 61a is also formed to have a width slightly greater than that of the opening 65a of the back film 65 and is disposed so as to extend beyond the edge 65a1 of the opening 65a and run into the opening 65a. Therefore, the entire perimeter of the edge of the opening 65a of the back film 65 can be covered by the extended portion 61b1 of the lower covering insulating film 61b, and the edge 65a1 of the opening 65a of the back film 65 can be covered by an extended portion 61a1 of the upper covering insulating film 61a as well.

SPECIFIC EXAMPLE 13

Figure 18:
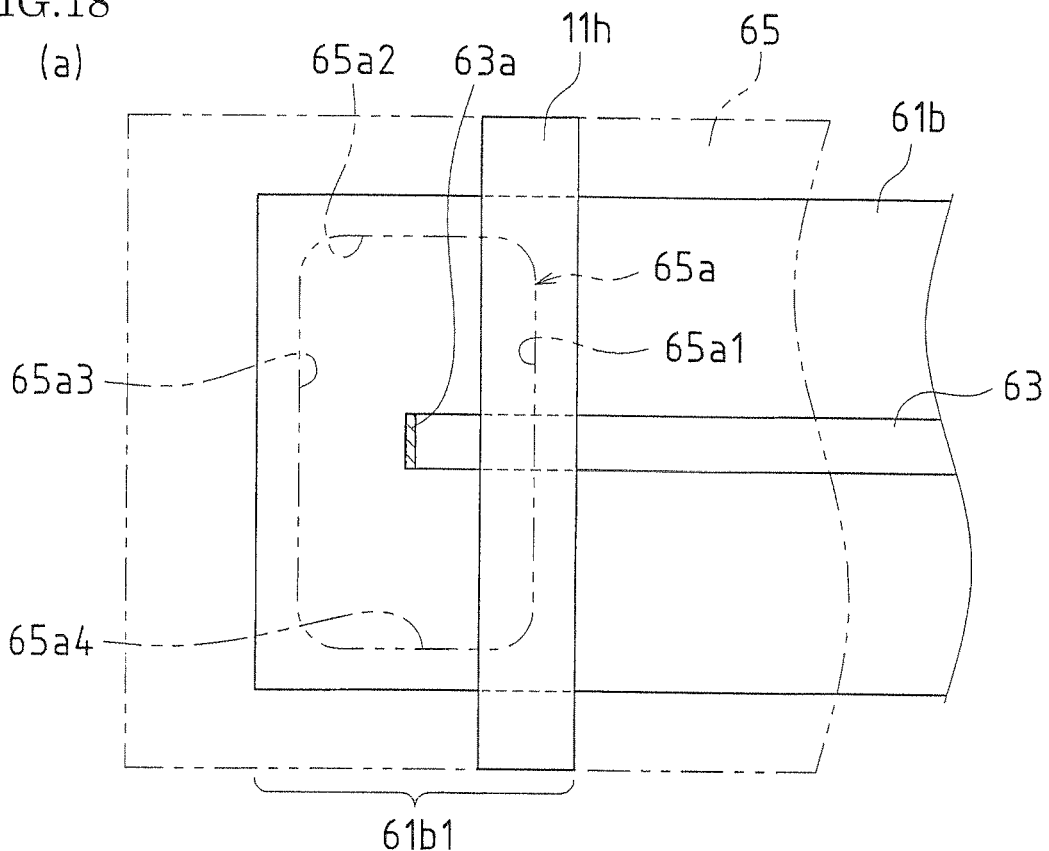
[FIG. 18]
Figure 18:
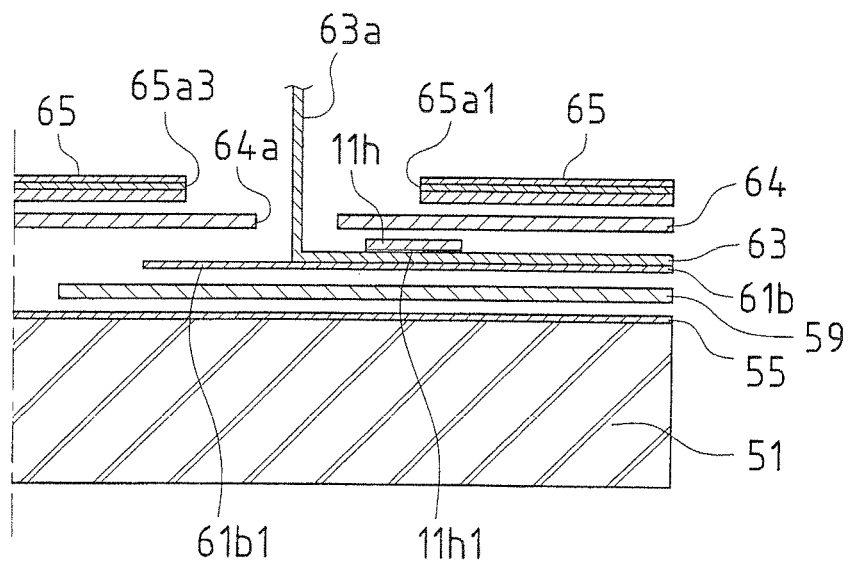

FIGS. 18(a) and 18(b) are a plan view (the back film 65 and the sealing insulating film 64 are not shown) and a cross-sectional view (precisely, an end view) of the periphery of an opening, for showing the shape and arrangement of an insulating sheet of Specific Example 13. FIGS. 18 show an example in the case of application to the solar cell module configured as shown in FIG. 4 (specifically, the solar cell module in which the lead wires 62 and 63 are covered only on one side, the side closer to the back face electrode of the solar cell 55). Also, FIGS. 18 show only one opening 65a, namely, the opening 65a through which the output lead portion 63a of the lead wire 63 is drawn out, but the other opening 65a through which the output lead portion 62a of the other lead wire is drawn out has the same structure.

Specific Example 13 is a variation of Specific Example 11 described above. In Specific Example 13, because the lead wire 63 is covered only on one side (the side closer to the back face electrode of the solar cell 55), a rectangular insulating sheet 11h is disposed between the lead wire 63 and the back film 65, as in Specific Example 1.

Specifically, the lower covering insulating film 61b of the lead wire 63 is formed to have a width slightly greater than the width of the opening 65a of the back film 65 and is disposed so as to extend beyond the edge 65a3 of the opening 65a. Therefore, the entire perimeter of the edge of the opening 65a of the back film 65 can be covered by an extended portion 61b1 of the lower covering insulating film 61b. On the other hand, the rectangular insulating sheet 11h is disposed so as to extend along the edge 65a1 of the opening 65a across which the lead wire 63 extends. The insulating sheet 11h is a sticky sheet in which a sticky agent 11h1 has been applied to the underside thereof and that is disposed between the lead wire 63 and the sealing insulating film (for example, EVA sheet) 64. The insulating sheet 11h is also formed to have a width even greater than the width of the lower covering insulating film 61b. When the insulating sheet 11h is disposed on the back face electrode film of the solar cell 55 so as to extend along the edge 65a1 of the opening 65a of the back film 65, the lead wire 63 is fixed or temporarily fixed onto the EVA sheet 59. In other words, the insulating sheet 11h provides insulation to the edge 65a1 of the opening 65a, as well as fixing the lead wire 63. The insulating sheet 11h therefore will not shift out of position relative to the edge 65a1 of the opening 65a in subsequent laminate processing an fix or temporarily fix the lead wire 63 such that the lead wire 63 will not shift out of position. Accordingly, the lead wire 63 can be reliably disposed and fixed in a position in which the lead wire 63 is not in contact with the end face of the opening 65a of the back film 65.

SPECIFIC EXAMPLE 14

Figure 19:
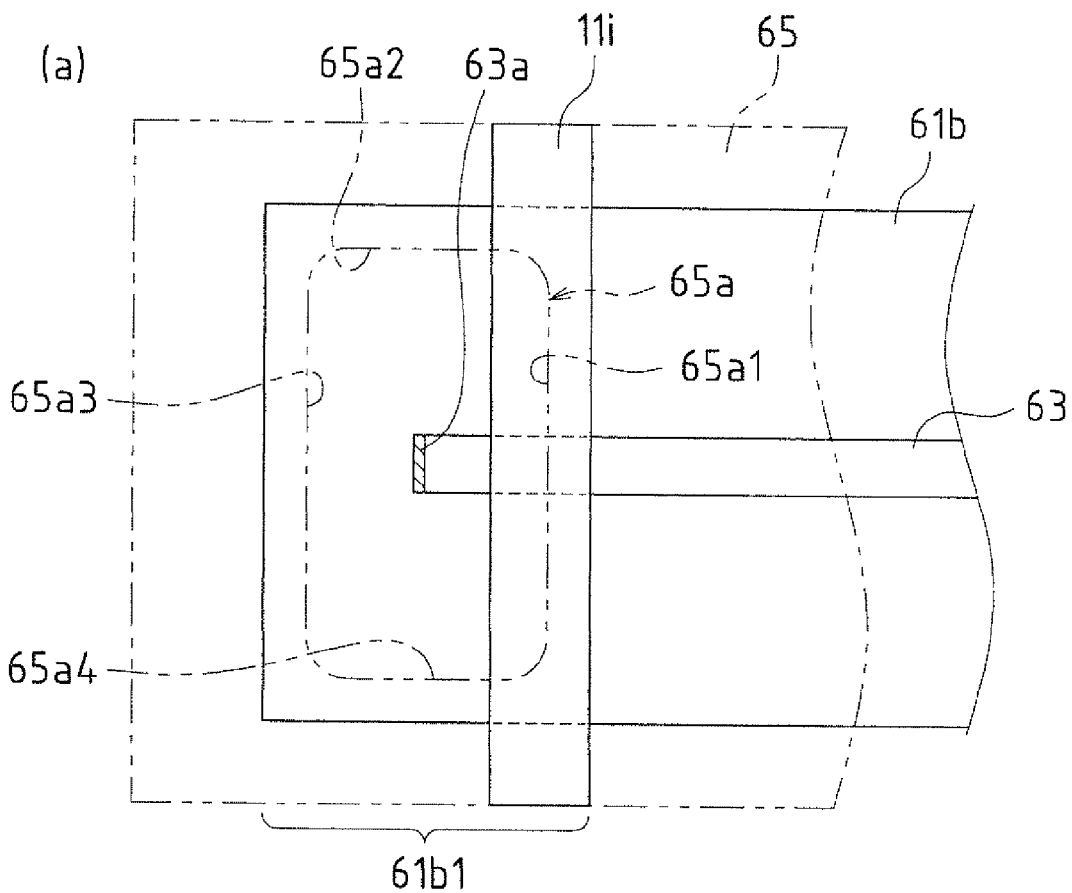
[FIG. 19]
Figure 19:
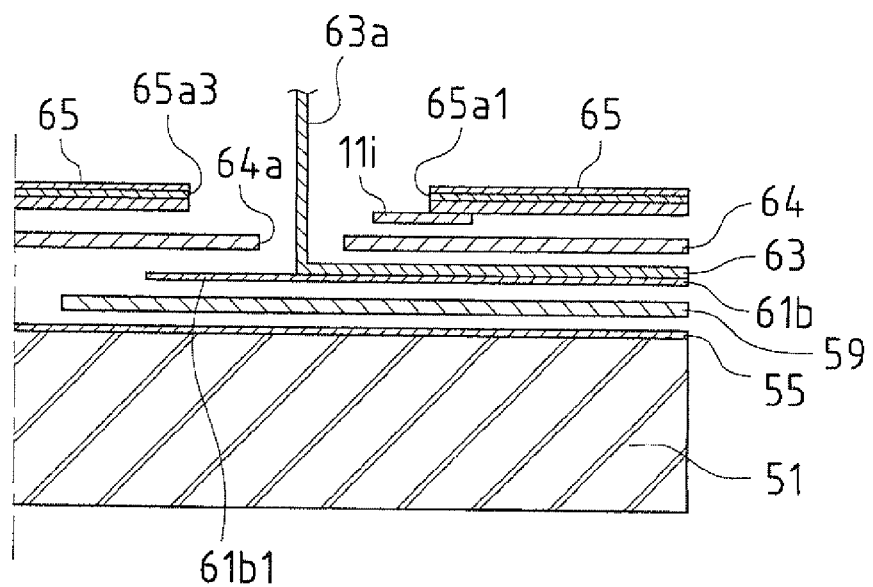

FIGS. 19(a) and 19(b) are a plan view (the back film 65 and the sealing insulating film 64 are not shown) and a cross-sectional view (precisely, an end view) of the periphery of an opening, for showing the shape and arrangement of an insulating sheet of Specific Example 14. FIGS. 19 show an example in the case of application to the solar cell module configured as shown in FIG. 4 (specifically, the solar cell module in which the lead wires 62 and 63 are covered only on one side, the side closer to the back face electrode of the solar cell 55). FIGS. 19 show only one opening 65a, namely, the opening 65a through which the output lead portion 63a of the lead wire 63 is drawn out, but the other opening 65a through which the output lead portion 62a of the other lead wire is drawn out has the same structure.

Specific Example 14 is a variation of Specific Example 13 described above, and a rectangular insulating sheet 11i is made shorter than the insulating sheet 11h of Specific Example 13.

Specifically, the lower covering insulating film 61b of the lead wire 63 is formed to have a width slightly greater than the width of the opening 65a of the back film 65, and is disposed so as to extend beyond the edge 65a3 of the opening 65a.

Therefore, the entire perimeter of the edge of the opening 65a of the back film 65 can be covered by an extended portion 61b1 of the lower covering insulating film 61b. On the other hand, the rectangular insulating sheet 11i is disposed so as to extend along the edge 65a1 of the opening 85a across which the lead wire extends. The insulating sheet 11i is disposed between the back film 65 and the sealing insulating film (for example, EVA sheet) 64. The insulating sheet 11i is formed to have a width that is slightly greater than the width of the opening 65a of the back film 65 but slightly less than the width of the lower covering insulating film 61b. When the insulating sheet 11i is disposed on the back face electrode film of the solar cell 55 so as to extend along the edge 65a1 of the opening 65a of the back film 65, the insulating sheet 11i is fixed or temporarily fixed to the underside of the edge 65a1 of the opening 65a of the back film 65 with an adhesive. Therefore, the insulating sheet 11i will not shift out of position relative to the edge 65a1 of the opening 65a in subsequent laminate processing.

SPECIFIC EXAMPLE 15

Figure 20:
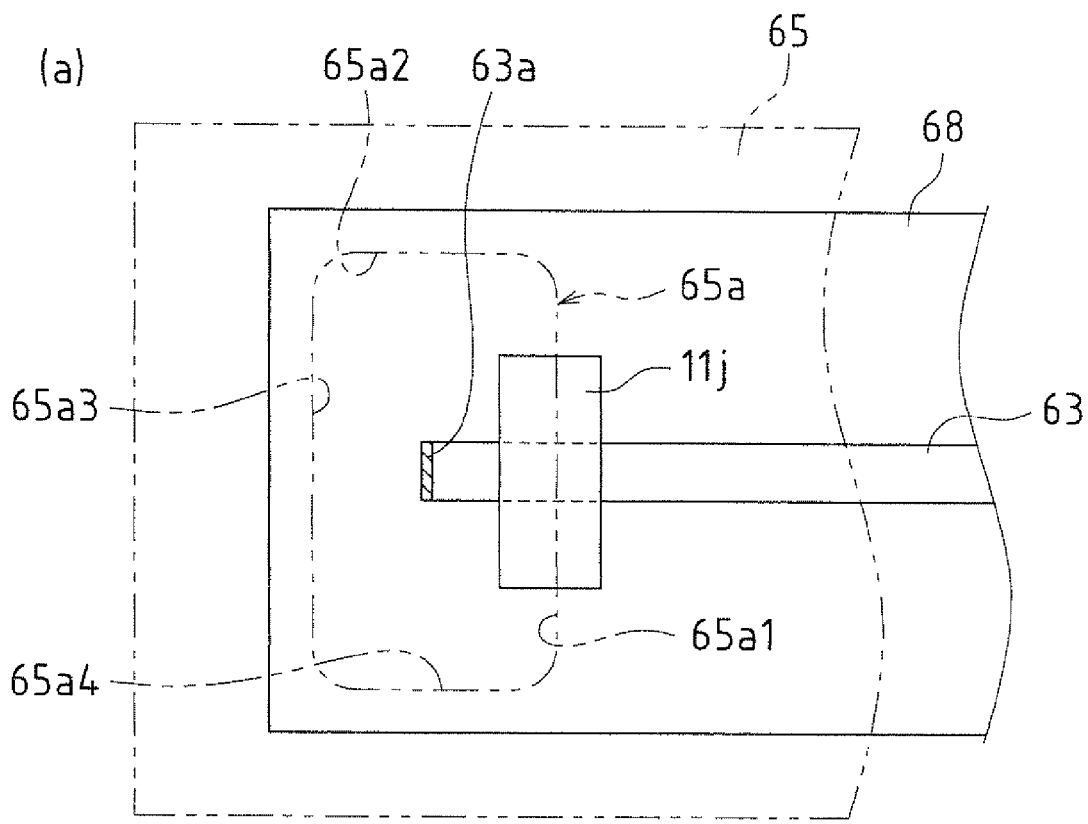
[FIG. 20]
Figure 20:
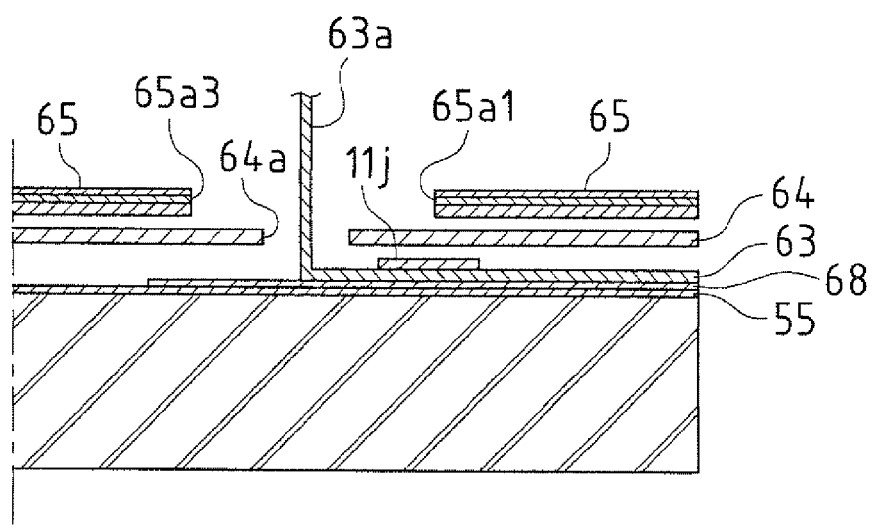

FIGS. 20(a) and 20(b) are a plan view (the back film 65 and the sealing insulating film 64 are not shown) and a cross-sectional view (precisely, an end view) of the periphery of an opening, for showing the shape and arrangement of an insulating sheet of Specific Example 15. FIGS. 20 show an example in the case of application to lead wires 62 and 63 that are uncovered and thus not insulated. FIGS. 20 show only one opening 65a, namely, the opening 65a through which the output lead portion 63a of the lead wire 63 is drawn out, but the other opening 65a through which the output lead portion 62a of the other lead wire is drawn out has the same structure.

In Specific Example 15, an insulating layer (insulating film) 68 for covering the underside of the lead wire 63 is provided on the back face electrode film of the solar cell 55. The insulating layer 68 is formed to have a width slightly greater than the width of the opening 65a of the back film 65, and is disposed so as to extend along the lead wire 63 and to extend beyond the edge 65a3 of the opening 65a. Therefore, the entire perimeter of the edge of the opening 65a of the back film 65 can be covered by the insulating layer 68.

Also, in Specific Example 15, because the lead wire 63 is not insulated (is not covered at all and thus bare), a rectangular insulating sheet 11j is disposed so as to extend along the edge 65a1 of the opening 65a across which the lead wire 63 extends. The insulating sheet 11j is a sticky sheet in which a sticky agent has been applied to the underside thereof and that is disposed between the lead wire 63 and the sealing insulating film (for example, EVA sheet) 64. When the insulating sheet 11j is disposed on the back face electrode film of the solar cell 55 so as to extend along the edge 65a1 of the opening 65a of the back film 65, the lead wire 63 is fixed or temporarily fixed onto the insulating layer 68. In other words, the insulating sheet 11j provides insulation to the edge 65a1 of the opening 65a, as well as fixing the lead wire 63. The insulating sheet 11j therefore will not shift out of position relative to the edge 65a1 of the opening 65a in subsequent laminate processing and fix or temporarily fix the lead wire 63 such that the lead wire 63 will not shift out of position. Accordingly, the lead wire 63 can be reliably disposed and fixed in a position in which the lead wire 63 is not in contact with the end face of the opening 65a of the back film 65.

SPECIFIC EXAMPLE 16

Figure 21:
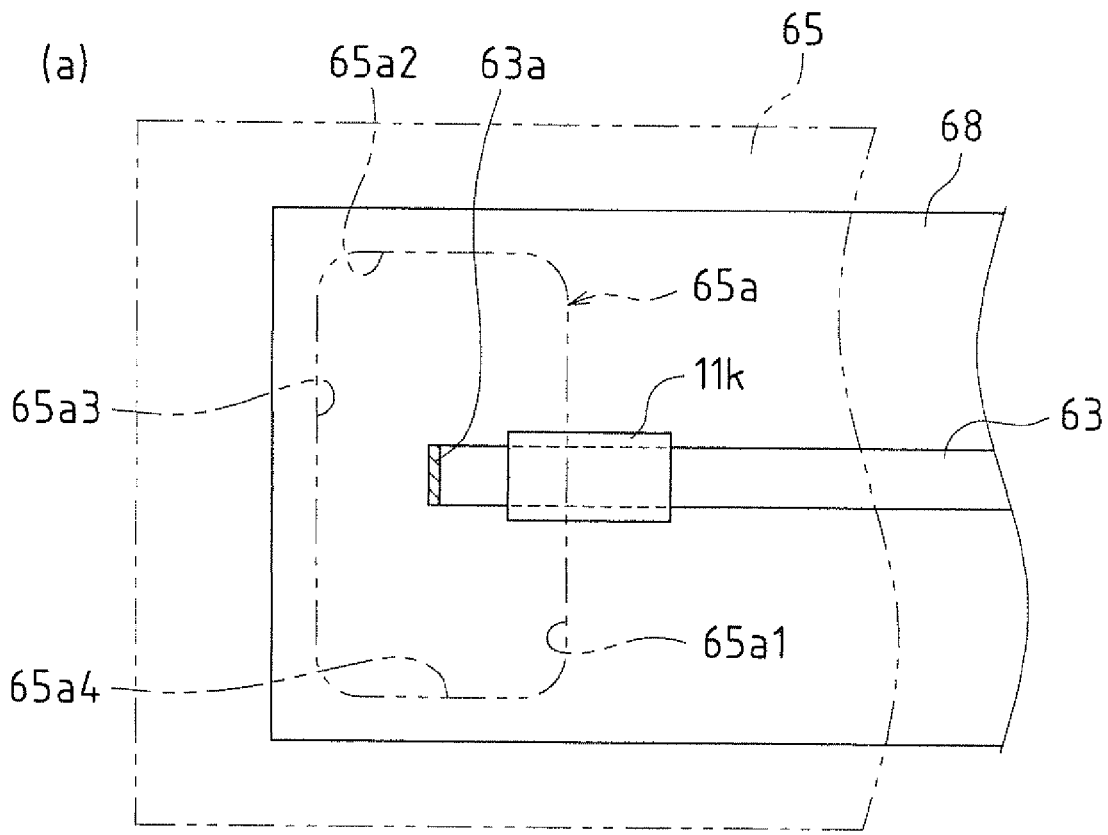
[FIG. 21]
Figure 21:
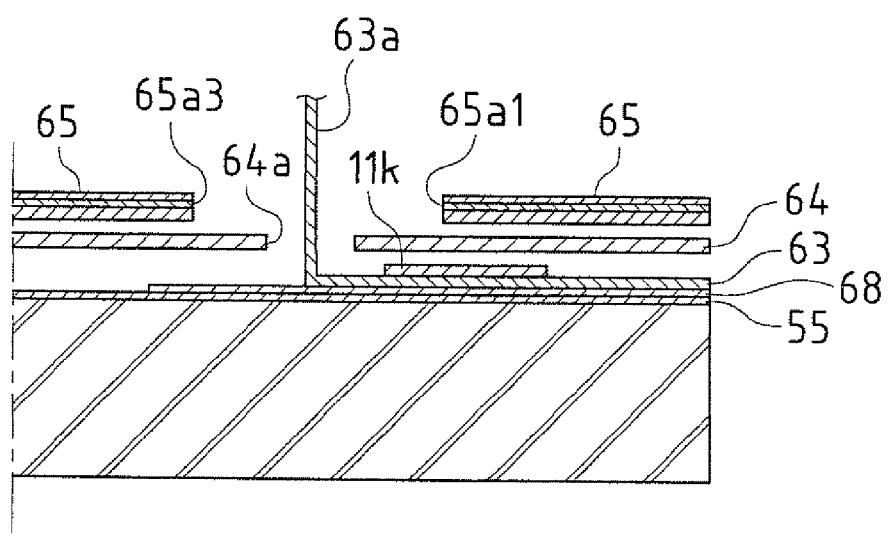

FIGS. 21(a) and 21(b) are a plan view (the back film 65 and the sealing insulating film 64 are not shown) and a cross-sectional view (precisely, an end view) of the periphery of an opening, for showing the shape and arrangement of an insulating sheet of Specific Example 16. FIGS. 21 show an example in the case of application to lead wires 62 and 63 that are uncovered and thus not insulated. Also, FIGS. 21 show only one opening 65a, namely, the opening 65a through which the output lead portion 63a of the lead wire 63 is drawn out, but the other opening 65a through which the output lead portion 62a of the other lead wire is drawn out has the same structure.

Specific Example 16 is a variation of Specific Example 15 described above, and a rectangular insulating sheet 11k is formed to have a width even shorter than the width of the insulating sheet 11j of Specific Example 15, and only the lead wire 63 portion is covered. In Specific Example 16 as well, the insulating sheet 11k is a sticky sheet in which a sticky agent has been applied to the underside thereof, When the insulating sheet 11k is disposed on the back face electrode film of the solar cell 55 so as to extend along the edge 65a1 of the opening 65a of the back film 65, the lead wire 63 is fixed or temporarily fixed onto the insulating layer 68. The other configurations are the same as those of Specific Example 5 shown in FIG. 21, and thus descriptions thereof are omitted here.

SPECIFIC EXAMPLE 17

Figure 22:
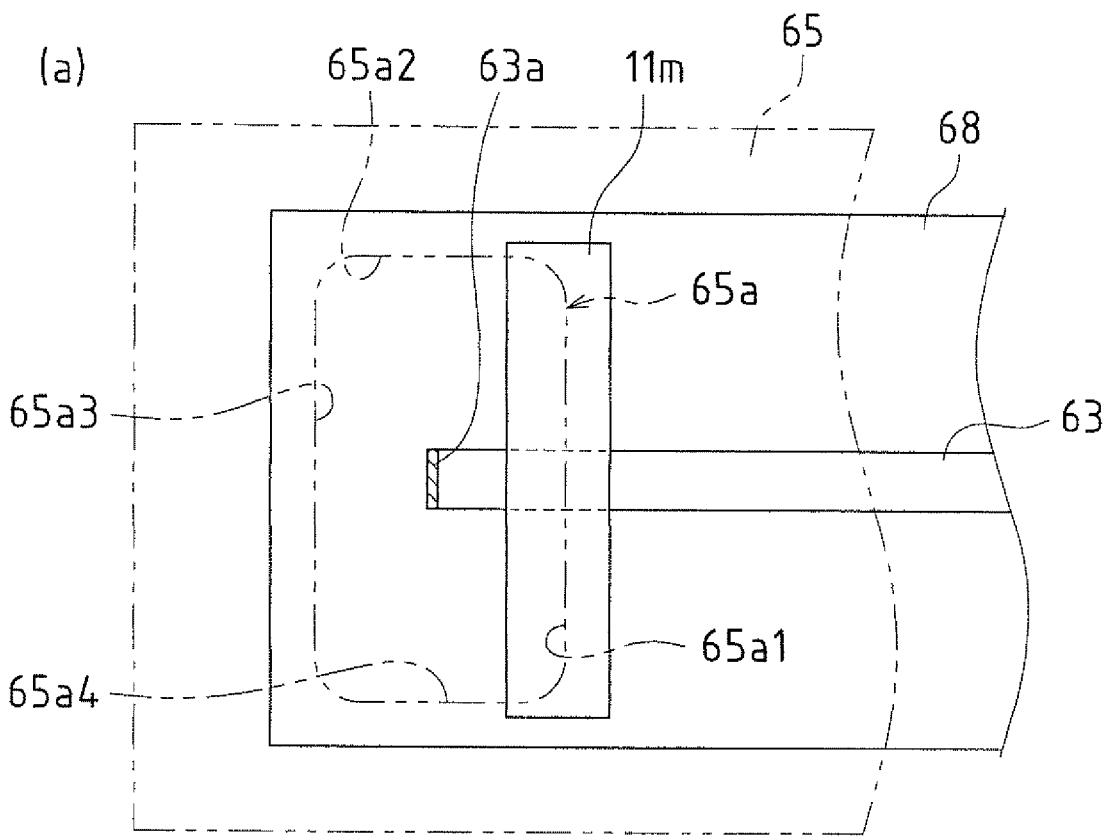
[FIG. 22]
Figure 22:
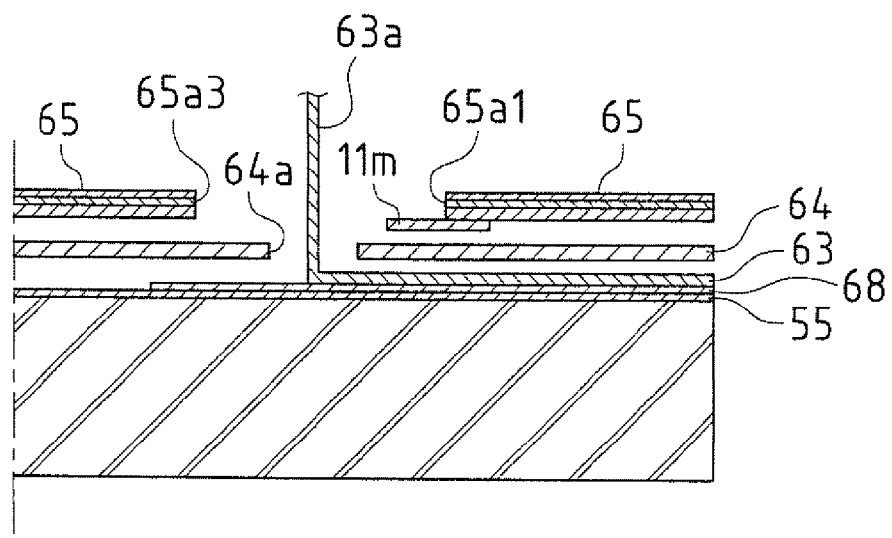
Figure 23:
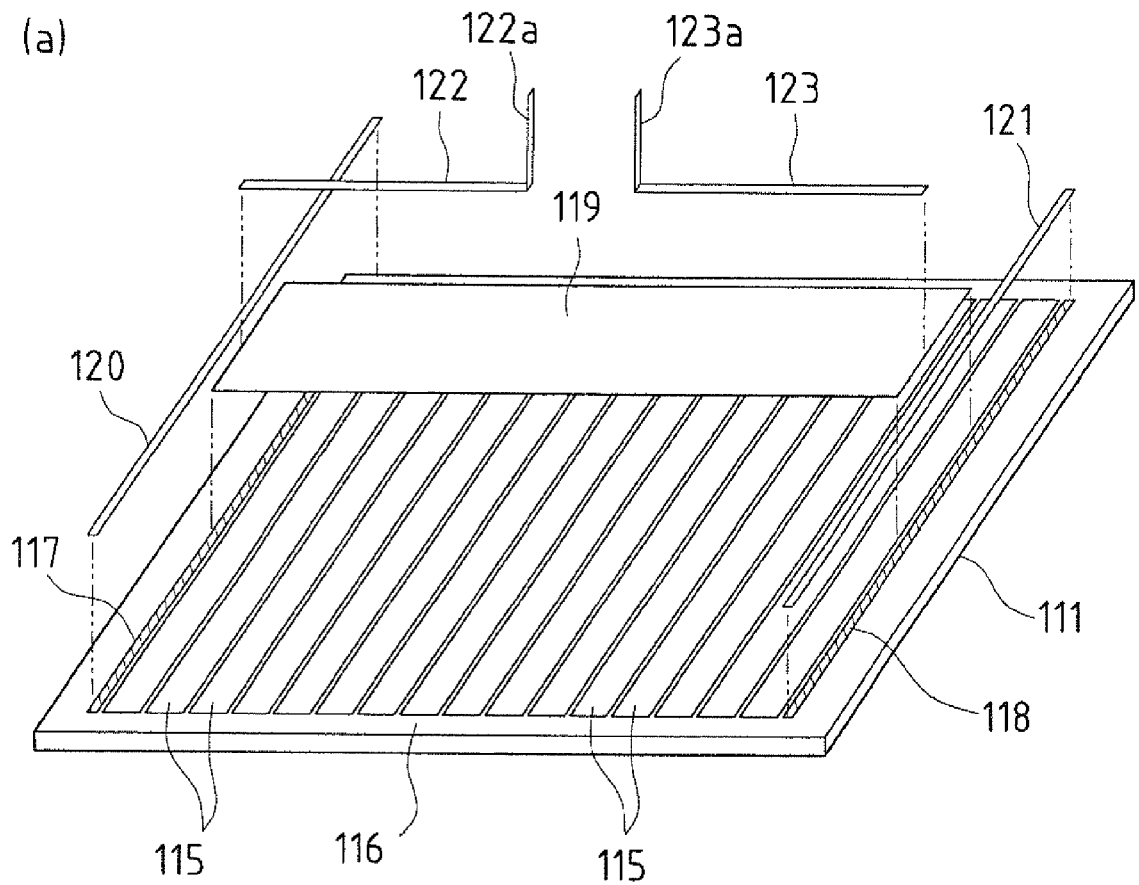
[FIG. 23]
Figure 23:
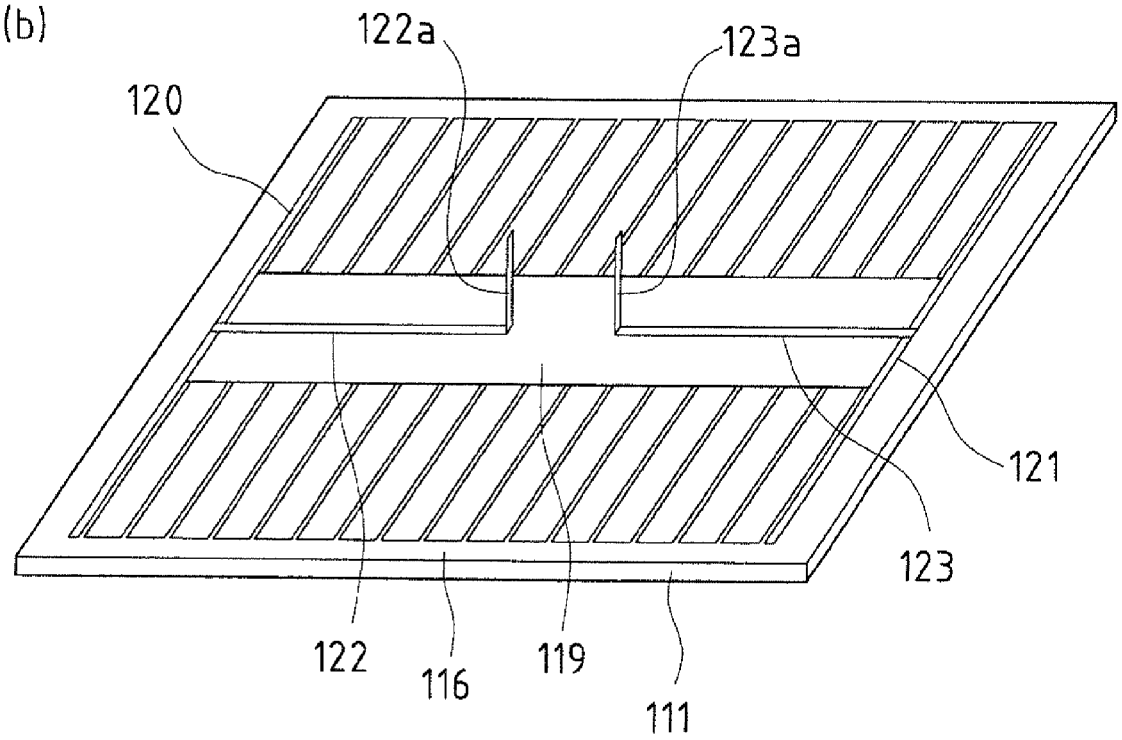
Figure 24:
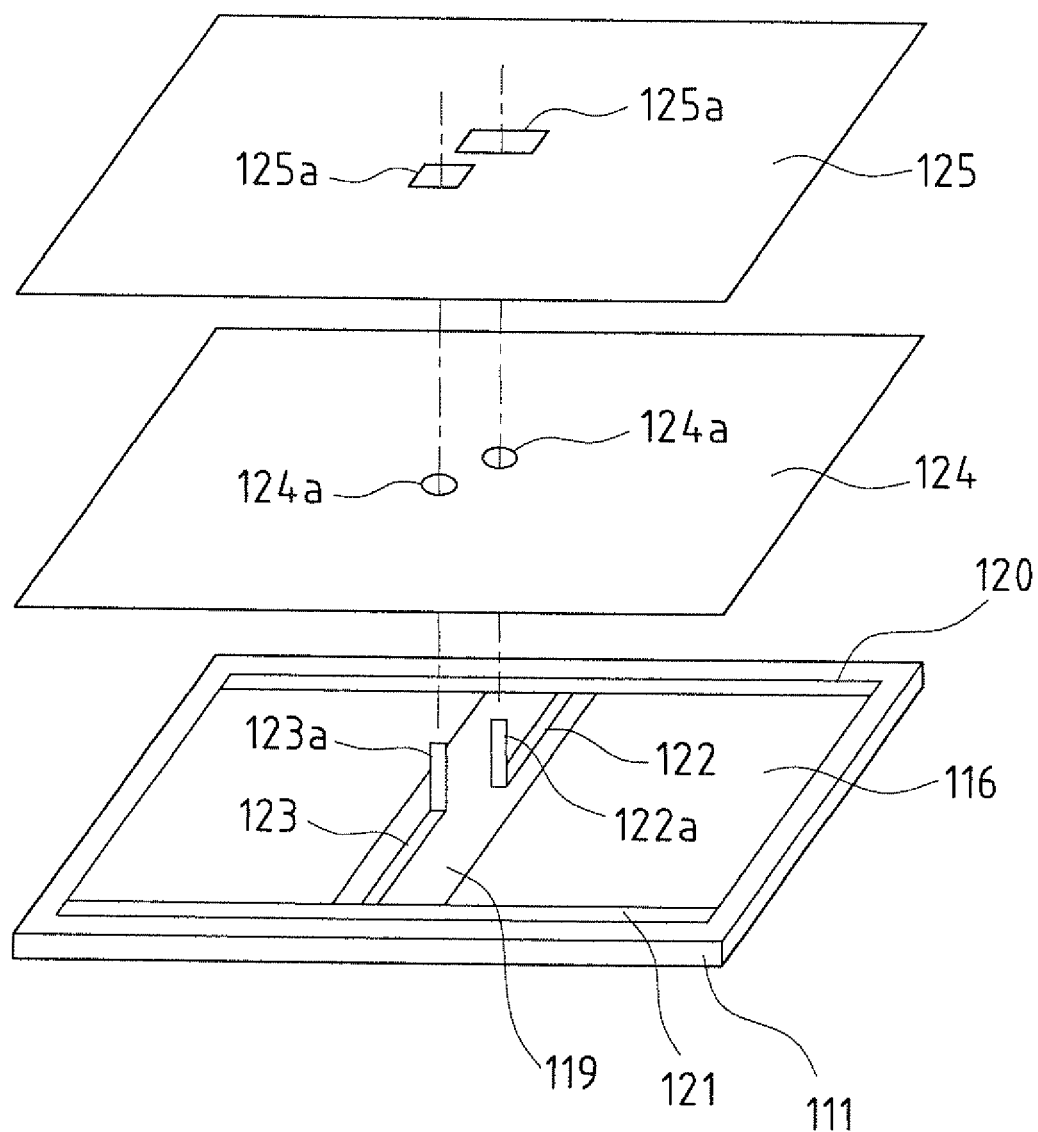
[FIG. 24]

FIGS. 22(a) and 22(b) are a plan view (the back film 65 and the sealing insulating film 64 are not shown) and a cross-sectional view (precisely an end view) of the periphery of an opening, for showing the shape and arrangement of an insulating sheet of Specific Example 17. FIGS. 22 show an example in the case of application to lead wires 62 and 63 that are uncovered and thus not insulated. Also, FIGS. 22 show only one opening 65a, namely, the opening 65a through which the output lead portion 63a of the lead wire 63 is drawn out, but the other opening 65a through which the output lead portion 62a of the other lead wire is drawn out has the same structure.

Specific Example 17 is a variation of Specific Example 15 described above, and a rectangular insulating sheet 11m is disposed between the back film 65 and the sealing insulating film 64.

Specifically, the insulating sheet 11m is disposed so as to extend along the edge 65a1 of the opening 65a across which the lead wire 63 extends. The insulating sheet 11m is disposed between the back film 65 and the sealing insulating film (for example, EVA sheet) 64. Also, the insulating sheet 11i is formed to have a width that is slightly greater than the width of the opening 65a of the back film 65 but slightly less than the width of the insulating layer 68. When the insulating sheet 11m is disposed on the back face electrode film of the solar cell 55 so as to extend along the edge 65a1 of the opening 65a of the back film 65, the insulating sheet 11m is fixed or temporarily fixed onto the underside of the edge 65a1 of the opening 65a of the back film 65 with an adhesive. Therefore, the insulating sheet 11m will not shift out of position relative to the edge 65a1 of the opening 65a in subsequent laminate processing.

The specific examples have been described in the context where one lead wire is drawn out from one opening 65a of the back film 65, but two lead wires 62 and 63 may be drawn out from one opening 65a. In this case, for example, in Specific Examples 2, 3, 5 and 7, the insulating sheet can be used as is. Specific Example 4, 6 can be applied as is by changing the other edge of the insulating sheet 11e bonded or adhesively fixed to the underside of one edge of the opening 65a of the back film. 65 to, for example, the edge 65a2 on the upper side of FIGS. 12(a) and 14(a) or the edge 65a4 on the lower side of the same. In other words, the other edge of the insulating sheet 11e bonded or adhesively fixed to the underside of one edge of the opening 65a of the back film 65 may be changed to any of the edges that do not intersect with the lead wire. This can be applied to the case of Specific Example 4, 6 described above as well.

The present invention may be embodied in various other forms without departing from the gist or essential characteristics thereof. Therefore, the embodiments given above are to be considered in all respects as illustrative and not limiting. The scope of the invention is indicated by the appended claims rather than by the foregoing description, and all modifications or changes that come within the meaning and range of equivalency of the claims are intended to be embraced therein.

This application claims priority on Japanese Patent Application No. 2008-304357 filed in Japan on Nov. 28, 2008, the entire content of which is incorporated herein by reference. Furthermore, the entire content of documents cited in the present specification is herein specifically incorporated by reference.

INDUSTRIAL APPLICABILITY

With the solar cell module and the method of manufacturing such a solar cell module according to the present invention, an electrical discharge between the back face electrode film and the end face of the opening of the back face protective sheet in the solar cell module can be blocked with reliability, and it is therefore possible to obtain a sufficient dielectric strength without causing an electrical discharge even when a dielectric strength test at a high voltage is performed. Accordingly, the present invention is useful in that the voltage of the solar cell module can be increased.

DESCRIPTION OF REFERENCE NUMERALS 11a to 11m Insulating Sheet
51 Light-Transmitting Insulating Substrate
55 Solar Cell
56 Solar Cell String (Thin Film Solar Cell String)
57 P-Type Electrode Terminal Portion
58 N-Type Electrode Terminal Portion
59 EVA Sheet
60a Positive Electrode Current Collecting Portion
60b Negative Electrode Current Collecting Portion
61 Insulating Film
62 Positive Electrode Lead Wire
63 Negative Electrode Lead Wire
62a, 63a Output Lead Portion
64 Sealing Insulating Film
65 Back Film
64a, 65a Opening

The invention claimed is:

1. A solar cell module in which a solar cell including a transparent electrode film, a photoelectric conversion layer and a back face electrode film is laminated in this order on a light-transmitting insulating substrate, and an insulated lead wire and a back face protective sheet having an opening through which an output lead portion of the lead wire is passed, are sequentially laminated on the back face electrode film of the solar cell,
  wherein an insulating sheet is disposed between the back face electrode film and the back face protective sheet so as to entirely overlap all edges of the opening of the back face protective sheet,
  the back face protective sheet and the back face electrode film are bonded together using a resin sheet disposed directly on the back face electrode film, and
  the insulating sheet is disposed between the lead wire and the back face protective sheet, and the lead wire is fixed onto the resin sheet by a sticky material disposed on an underside of the insulating sheet facing the back face electrode film.

* * * * *